(12) United States Patent
Romanyszyn et al.

(10) Patent No.: US 7,810,676 B2
(45) Date of Patent: Oct. 12, 2010

(54) MULTIPLE BRAND ICE BEVERAGE DISPENSER

(75) Inventors: Adrian M. Romanyszyn, San Antonio, TX (US); Paul S. Sudolcan, Seguin, TX (US); Alfred A. Schroeder, San Antonio, TX (US); Roberto Rosales, Oslo (NO)

(73) Assignee: Lancer Partnership, Ltd., San Antonio, TX (US)

( * ) Notice: Subject to any disclaimer, the term of this patent is extended or adjusted under 35 U.S.C. 154(b) by 0 days.

(21) Appl. No.: 12/587,277

(22) Filed: Oct. 5, 2009

(65) Prior Publication Data
US 2010/0025431 A1 Feb. 4, 2010

Related U.S. Application Data

(62) Division of application No. 10/677,854, filed on Oct. 2, 2003.

(51) Int. Cl.
*B67D 7/74* (2010.01)
(52) U.S. Cl. .................. 222/129.1; 222/144.5; 345/173
(58) Field of Classification Search ............. 222/129.1, 222/130, 129.2, 135, 129.3, 129.4, 142.6, 222/144.5, 146.6; 62/389–391, 393, 396; 345/173
See application file for complete search history.

(56) References Cited

U.S. PATENT DOCUMENTS

| | | | | |
|---|---|---|---|---|
| 4,377,049 A | * | 3/1983 | Simon et al. | 40/465 |
| 5,058,773 A | * | 10/1991 | Brill et al. | 222/129.4 |
| 5,299,716 A | * | 4/1994 | Hawkins et al. | 222/146.6 |
| 5,836,481 A | * | 11/1998 | Strohmeyer et al. | 222/182 |
| 5,947,334 A | * | 9/1999 | Rudick et al. | 222/129.2 |
| 5,967,367 A | * | 10/1999 | Orsborn | 222/30 |
| 6,102,246 A | * | 8/2000 | Goulet et al. | 221/11 |
| 6,321,802 B1 | * | 11/2001 | Weeks et al. | 141/362 |
| 6,574,981 B2 | * | 6/2003 | Schroeder | 62/306 |

* cited by examiner

*Primary Examiner*—Frederick C. Nicolas
(74) *Attorney, Agent, or Firm*—Christopher L. Makay

(57) ABSTRACT

A beverage dispenser for dispensing beverages includes a touch panel assembly, removable fittings in a carbonator, a carbonator probe, and a carbonator pump assembly removable from a front of the beverage dispenser. The touch panel assembly includes a light source for backlighting a user interface and providing the dispenser with a visual presence. Electrode traces in the touch panel assembly detect interruptions in electrode fields and are accepted as user inputs for dispensing a beverage. A controller conducts the lighting, dispensing, and reconfiguring operations for the flavor selection areas on the user interface. The touch panel assembly further includes provisions for increasing a user interface area to increase visibility of a particular flavor, as well as bonus flavors on a beverage dispenser. The removable fittings each include an orifice for entry of water to be carbonated into the carbonator. The carbonator probe is a single wire probe with timed refill.

11 Claims, 29 Drawing Sheets

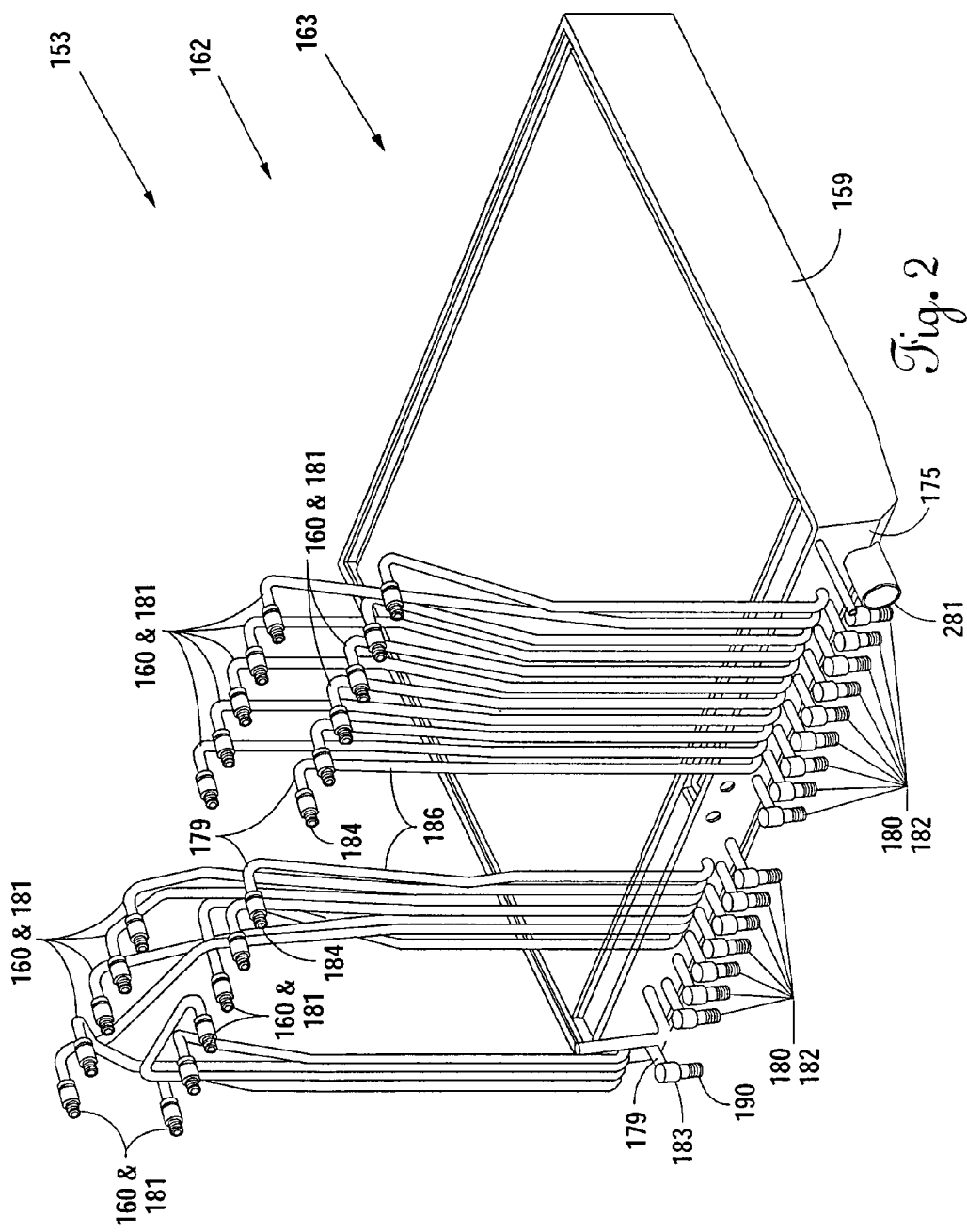

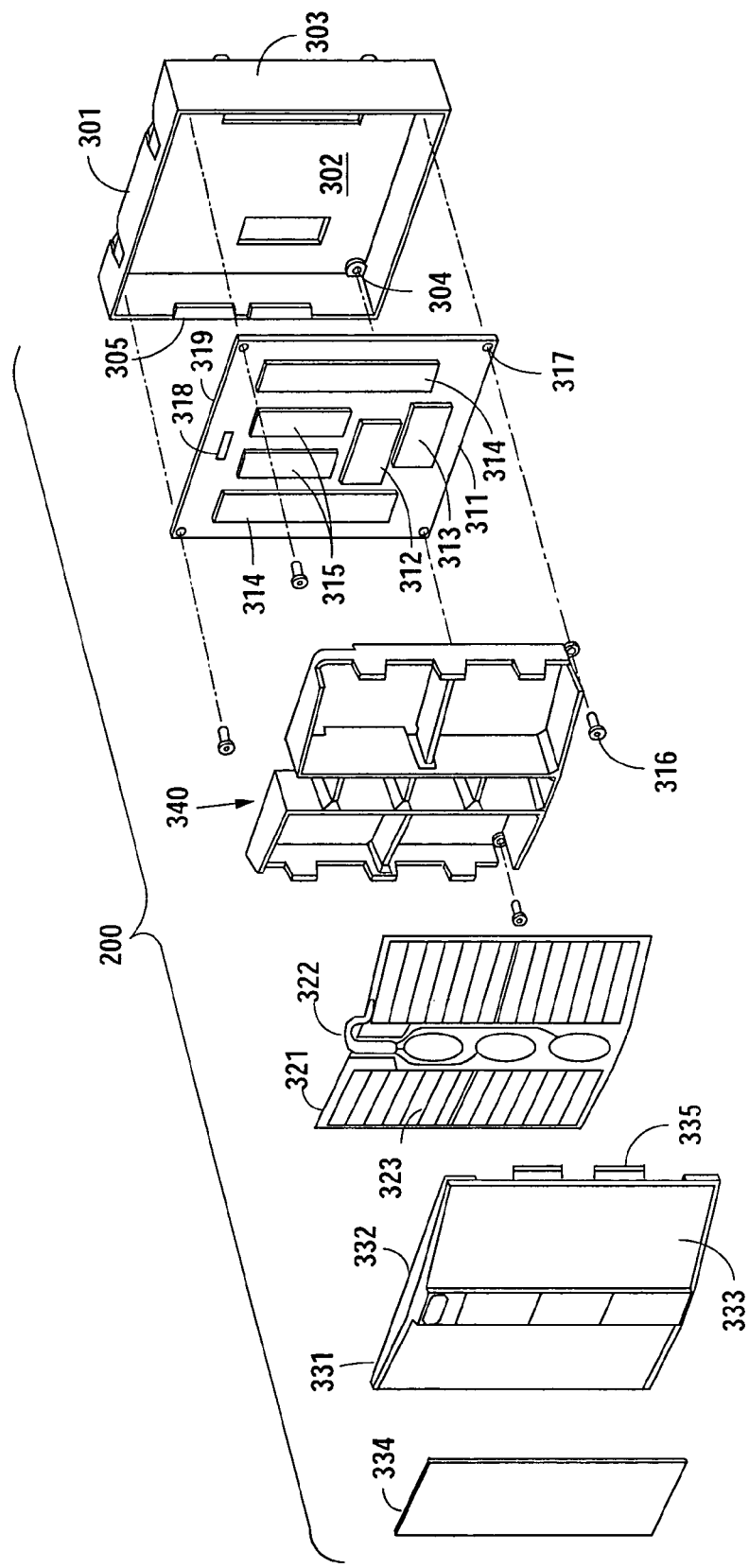

( 2 BRANDS )   ( 3 BRANDS )

( 4 BRANDS )   ( 3 BRANDS )

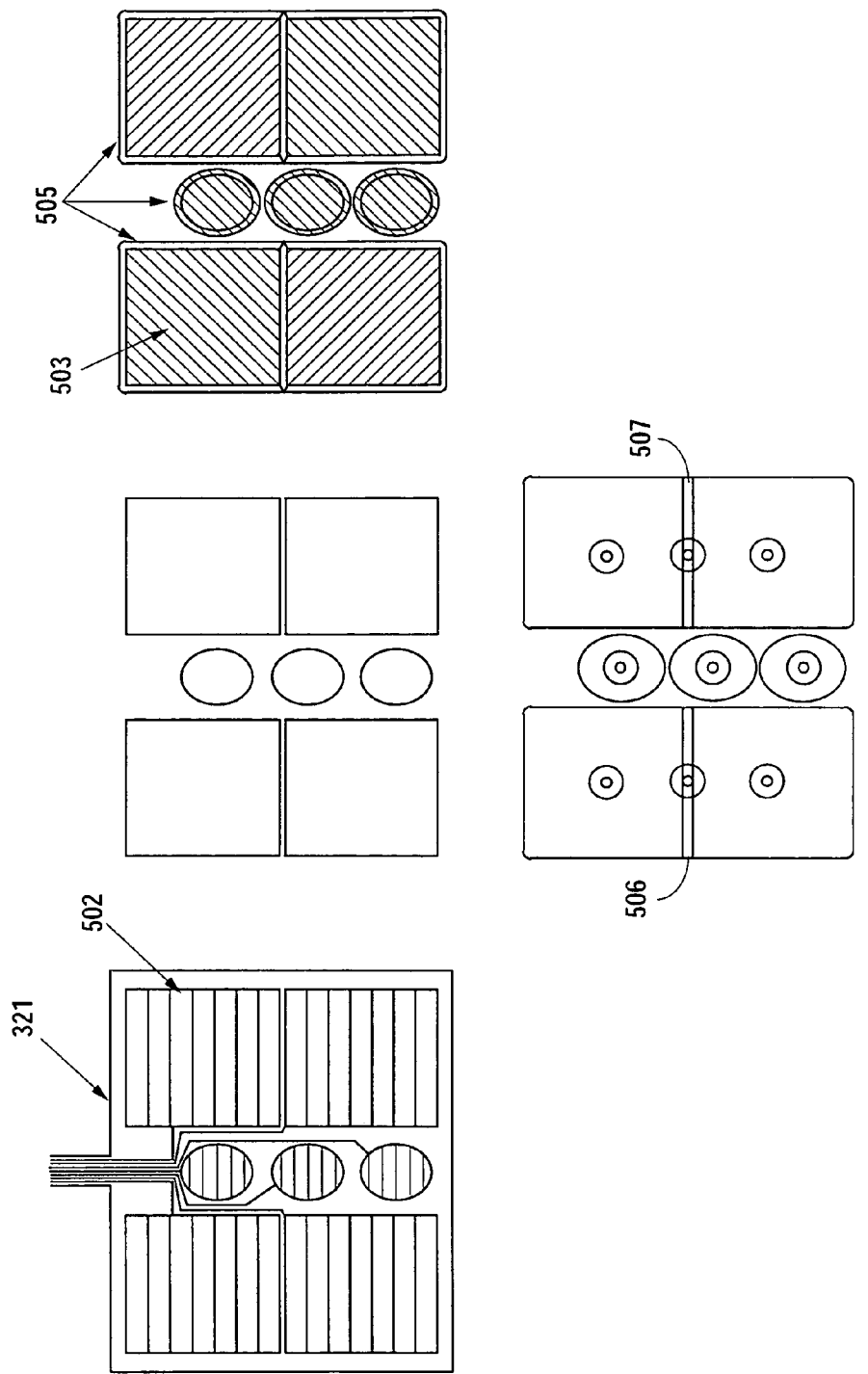

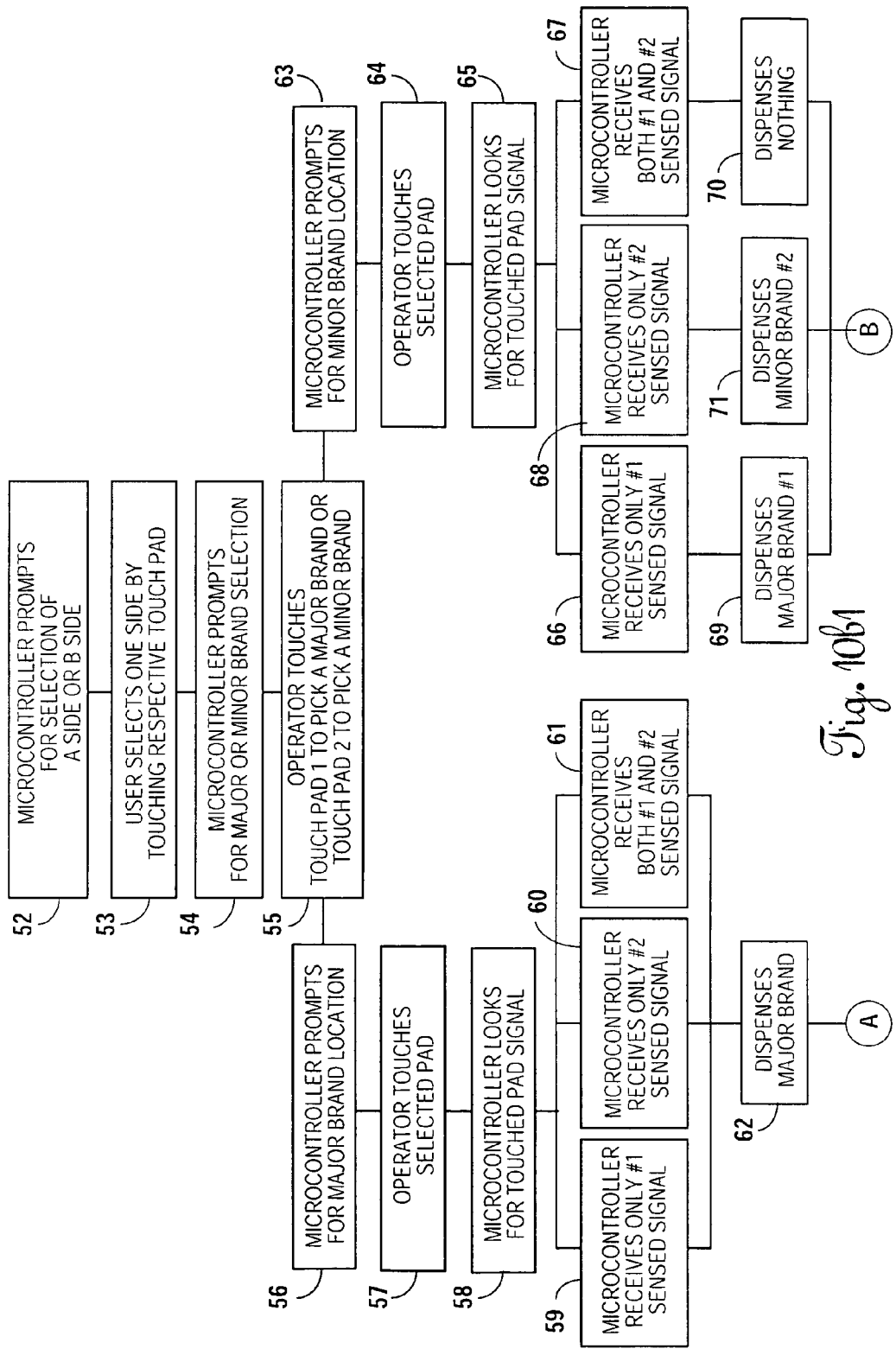

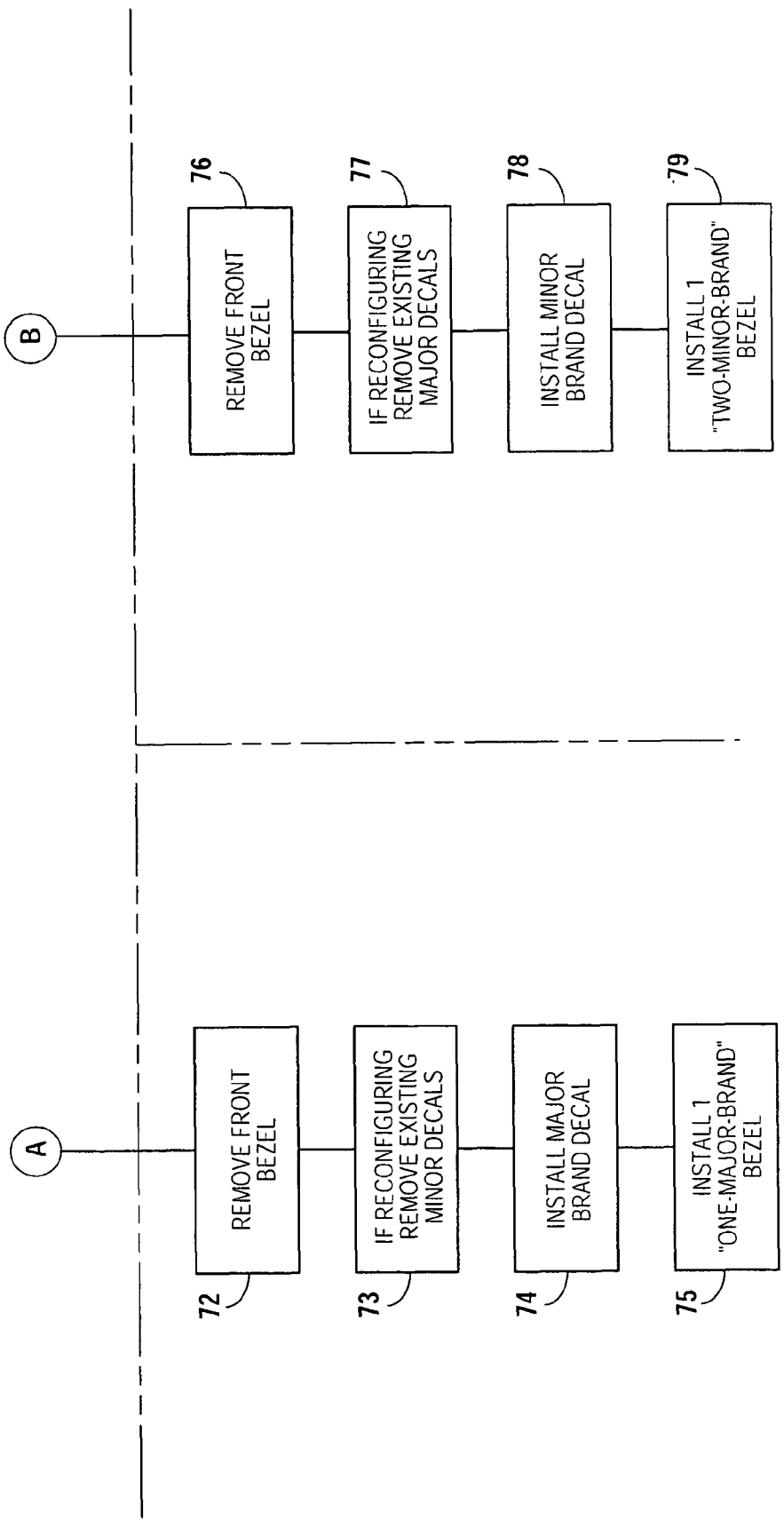
Fig. 1062

MULTIPLE BRAND ICE BEVERAGE DISPENSER

CROSS-REFERNCE TO RELATED APPLICATION

This application is a divisional of patent application Ser. No. 10/677,854, which was filed Oct. 2, 2003.

BACKGROUND OF THE INVENTION

1. Field of the Invention

The present invention relates to beverage dispensers and, more particularly, but not by way of limitation, to configuring of beverage dispenser flavors.

2. Description of the Related Art

In the industry of beverage dispensing, dispensers are typically regarded as vehicles for the larger beverage firms to use in the promotion of sales. Beverage dispensers on the market are typically allocated based on volume. This process lends itself to locking in on a beverage firm and its product base. All major beverage firms have a product base which may include several high volume products, or major brands and several lower volume products, or minor brands. These different major and minor brands usually have the same size labels because dispensers currently produced by the manufacturers have a product valve scheme. In this product valve scheme, the dispenser width is usually evenly split between the number of valves and their associated labels. As such, major brands usually have the same amount of label space as the minor brands, unless flavors are duplicated on the dispenser. This process does not really increase consumer visibility for the major brands. This is usually accomplished through a marquis or other signage, which usually highlights one flavor.

Furthermore, most dispensers are mechanically driven, and typically, cannot change the number of brands without making hardware changes. Therefore, it would be advantageous to have a dispenser that would be easily configurable, thereby allowing the customers to independently react to major vs. minor brand marketing and visibility.

SUMMARY OF THE INVENTION

In accordance with the present invention, a beverage dispenser for dispensing beverage drinks includes a touch panel assembly, removable fittings in a carbonator, and a carbonator pump assembly that is removable from a front of the dispenser. The touch panel assembly includes a light source for backlighting a user interface and providing the dispenser with a visual presence. The touch panel assembly further includes a controller, and an electrode board having electrode traces that generate electrode fields. Interruptions in the electrode fields are discernable by the controller, and interpreted as a user input for dispensing of a beverage drink.

Interpretation of the interruptions in the electrode fields is configurable, such that two adjacent electrodes may be interpreted as a single flavor choice. In this arrangement, major brands may receive an increased frontal display and activation area on the touch panel assembly. Configuring of the touch panel assemblies may be accomplished manually or automatically through the use of the controller.

The removable fittings in the carbonator each include an orifice through which water to be carbonated must pass to enter the carbonator tank. The ability to remove the fittings allows for cleaning operations and carbonator tuning operations to be conducted on-site. The invention further includes a method for removing the fittings for replacement or service.

The carbonator pump assembly is integral to the dispenser. The carbonator pump assembly is located in a front portion of the beverage dispenser, and is removable for service from the front of the beverage dispenser. A method for removing the carbonator pump assembly is also disclosed.

It is, therefore, an object of the present invention to provide a beverage dispenser with a backlit touch panel assembly to provide the dispenser with a visual presence.

It is further an object of the present invention to provide a beverage dispenser with a touch panel assembly having configurable electrode traces and a controller to interpret an interruption in an electrode field generated by the electrode traces as a user input.

It is yet further an object of the present invention to provide a carbonator with removable fittings, the fittings each including an orifice through which water to be carbonated must pass.

It is still yet further an object of the present invention to provide a beverage dispenser with an integral carbonator pump assembly, accessible from a front portion of the beverage dispenser.

Still other objects, features, and advantages of the present invention will become evident to those of ordinary skill in the art in light of the following.

BRIEF DESCRIPTION OF THE DRAWINGS

FIG. 2 provides an isometric view of a cold plate assembly.

FIG. 6 is an exploded view of the touch panel assembly.

FIG. 8a illustrates the relationship between electrodes and sensing areas.

FIGS. 10b1 and 10b2 provide a method flowchart for passive configuration of touch pad assemblies using a manual selection.

DETAILED DESCRIPTION OF THE PREFERRED EMBODIMENT

As required, detailed embodiments of the present invention are disclosed herein: however, it is to be understood that the disclosed embodiments are merely exemplary of the invention, which may be embodied in various forms. It is further to be understood that the figures are not necessarily to scale, and some features may be exaggerated to show details of particular components or steps.

The invention at hand is a dispenser design that addresses service issues on dispensers including carbonator pump servicing and the configuring of major vs. minor brand soft drinks and flavorings. The new design provides access to the carbonator motor and pump assembly from the front of the dispenser and an easily configurable conversion from major to minor brands as well as minor to major brands and flavorings. The system also provides for backlighting of the user interface panels through the use of LEDs. The interface panels and valve hardware complement each other to provide a modular panel setup, thereby providing further flexibility in the setup of the dispenser.

Figure 1:
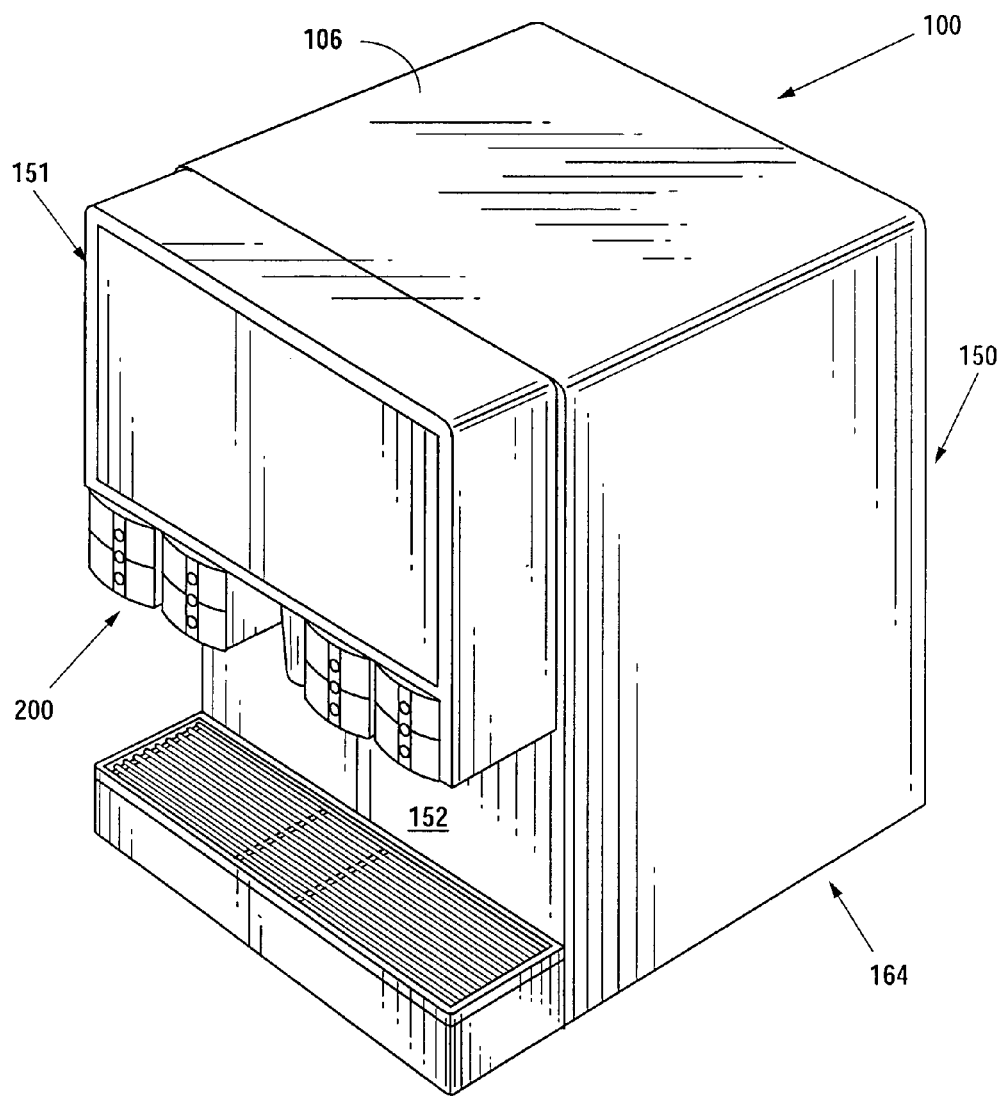
FIG. 1 provides an isometric view of a dispenser.

As shown in FIG. 1, a dispenser 100 is a processor controlled beverage dispenser whereby a customer is allowed to approach the machine and make a selection from an interface panel. In this preferred embodiment, the user may dispense ice, water, beverages, flavorings and the like. The dispenser 100 includes a housing 150, a plurality of touch panel assemblies 200, a merchandiser 151, a splash plate 152 and a wrapper 164. The touch panel assemblies 200 are located on a front 105 of the dispenser 100 for access by consumers. The merchandiser 151 is located above the touch panel assemblies 200 for visual recognition. The splash plate 152 further closes out the front 105 of the dispenser 100. The remaining sides are closed out through the use of the wrapper 164. A lid 106 closes out the top portion of the dispenser 100.

Figure 1A:
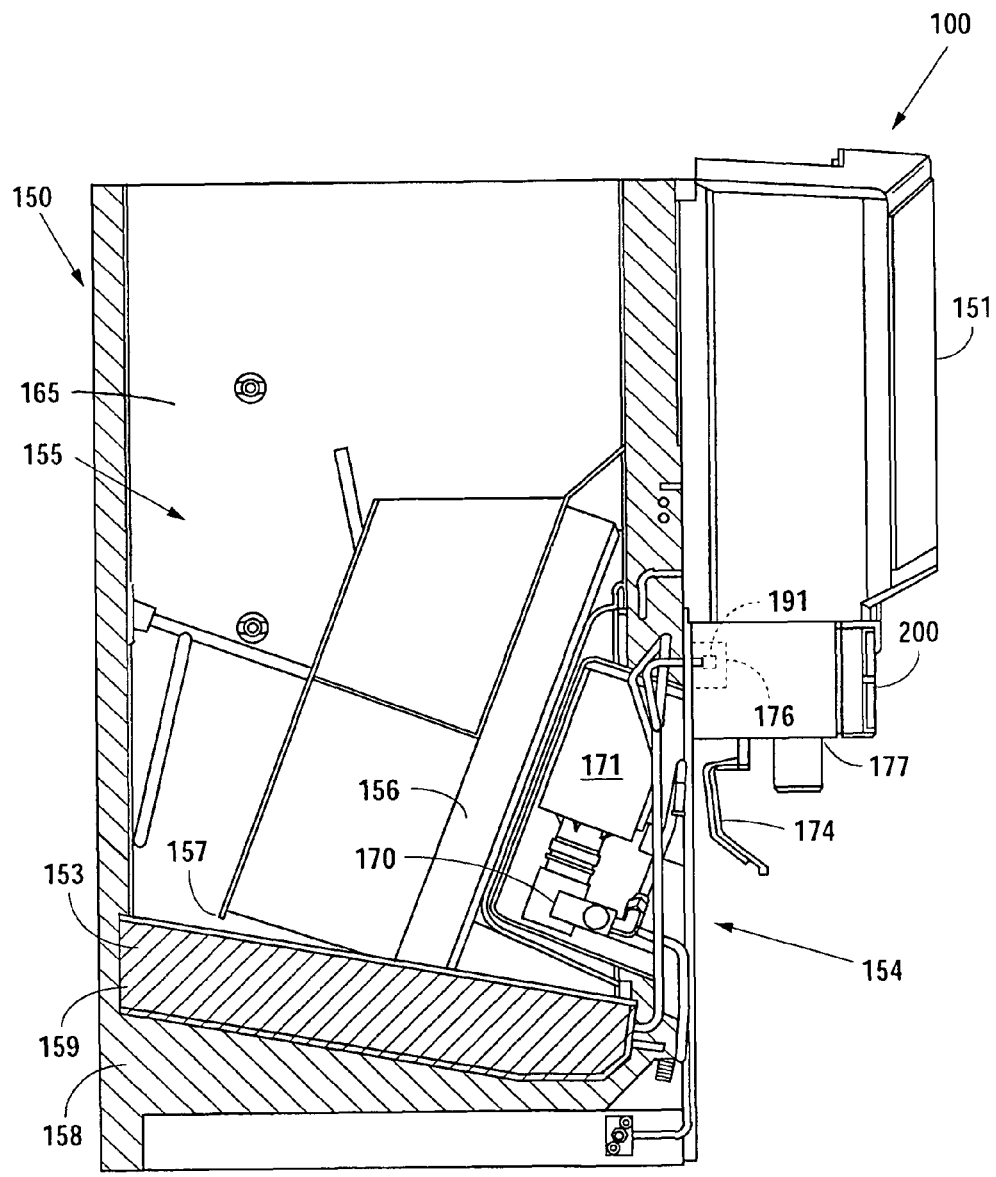
FIG. 1a provides a cross section of a dispenser.
Figure 1B:
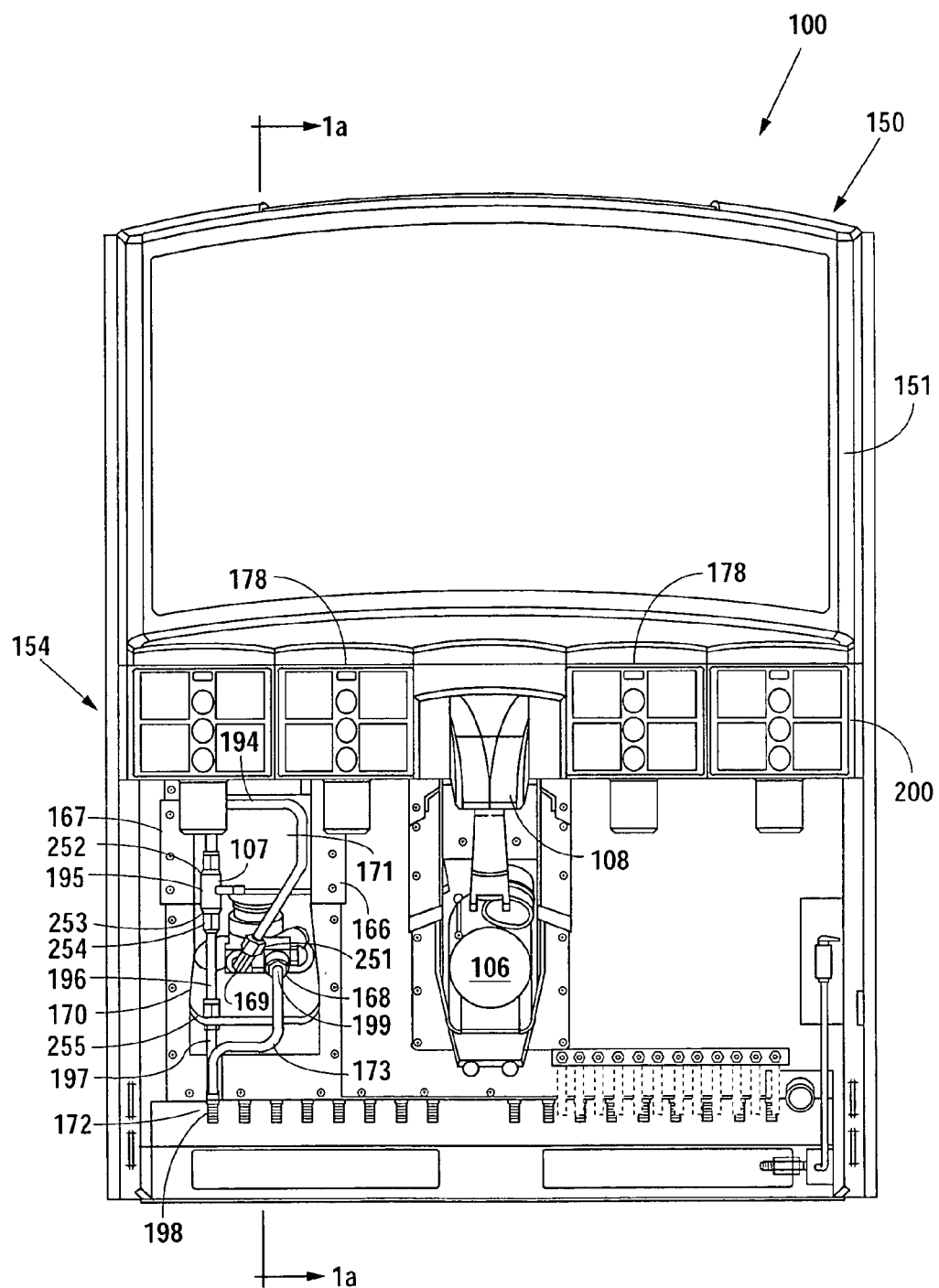
FIG. 1b provides a front view of a dispenser.

The housing 150 includes a cold plate assembly 153, a carbonator pump assembly 154, an ice reservoir liner 155, an ice paddlewheel 156, a paddlewheel shroud 157 and foam 158. The ice reservoir liner 155, having an interior cavity 165, rests on the cold plate assembly 153. The reservoir liner 155 and the cold plate assembly 153 are housed in the interior of the dispenser housing 150, therein creating a cavity between the assembly and the housing 150. The cavity is filled with foam 158 for insulating purposes. The interior cavity 165 of the reservoir liner 155 is used to store ice for dispensing. As shown in FIGS. 1a-1b, the ice paddlewheel 156 is mounted in the interior cavity 165 and is connectable to a motor 106 that rotates the paddlewheel 156. A lower portion of the ice paddlewheel 156 is surrounded by a shroud 157, therein forcing ice toward the paddlewheel 156 for dispensing. The paddlewheel 156 rotates to move ice to a dispensing port 108 that passes through the liner 155 and the dispenser housing 150. This operation is activated by depressing an ice dispensing lever 174 located on the front 105 of the dispenser 100.

The cold plate assembly 153 includes a plurality of concentrate tubes 160, an uncarbonated water circuit 162 and a carbonated water circuit 163, all of which are disposed into the cold plate 159 for chilling product before dispensing. The cold plate assembly 153 further includes a cast-in-place carbonator tank 161 as disclosed in U.S. Pat. No. 6,574,981, entitled Beverage Dispensing with Cold Carbonation, filed on Sep. 24, 2001, the disclosure of which is hereby incorporated by reference. The concentrate tubes 160, having an inlet 180 and an outlet 181, are connectable to concentrate sources through a barb fitting 182. The barb fitting 182 is accessible from the front 105 of the dispenser 100 for servicing and connection. The concentrate tubes 160 extend upward and bend to enter a front face 175 of the cold plate 159. The concentrate tubes 160 then make multiple passes in the interior of the cold plate 159 to provide adequate cooling length for the expected flowrates. The concentrate tubes 160 then exit the cold plate 159 and turn upward along the vertical plane until they reach the touch panel assemblies 200 where they extend horizontally. The concentrate tube outlet 181 then connects to a fluid passage 191 of a backblock 176. The backblock 176 contains a fluid passage 191 to connect the concentrate tube 160 to a dispensing valve 177, for mixing with water or the like.

The uncarbonated water circuit 162 is used to deliver water from a water source to the two innermost dispensing valves 178 for dispensing. The uncarbonated water circuit 162, in this preferred embodiment, includes a plain water tube 179 having a plain water tube inlet 183 and a plain water tube outlet 184. Inside of the cold plate 159, the uncarbonated water circuit 162 includes manifolds and serpentine coils, two each in this preferred embodiment, leading to two riser tubes 186. The riser tubes 186 exit the cold plate 159 and attach to backblocks 176 which, in turn, attach to the plain water dispensing valves 178. The plain water inlet 183 includes a barb fitting 190 and is connectable to a water source. The barb fitting 190 is located near the front 105 of the dispenser 100 for servicing and connection.

The carbonated water circuit 163 begins outside of the cold plate 159, near the front 105 of the dispenser 100. The carbonated water circuit 163 includes an inlet tube 173, a carbonator pump assembly 154, carbonator pump outlet tube 194, a check valve 195, an extension tube 196 and a cold plate entry tube 197. The inlet tube 173 contains an inlet 198 and an outlet 199. The inlet 198 contains a barb fitting 172 for connection to a water source. The barb fitting 172 is located near the front 105 of the dispenser 100 for servicing and connection. The outlet 199 of the inlet tube 173 connects to the carbonator pump assembly 154.

The carbonator pump assembly 154 includes a pump 170 connectable to a motor 171, and a mounting bracket 167. The pump 170 includes an inlet port 168 and an outlet port 169. The outlet 199 of inlet tube 173 connects to the pump inlet port 168. The outlet port 169 of the pump 170 is connectable to a first end 251 of the pump outlet tube 194. A second end 252 of the pump outlet tube 194 connects to an inlet port 107 of the check valve 195. An outlet port 253 of the check valve 195 is connectable to an entrance port 254 of the extension tube 196. An exit port 255 of the extension tube 196 then connects to the cold plate assembly 153 through the cold plate entry tube 197. The cold plate entry tube 197 extends downward and bends to enter the front face 175 of the cold plate 159.

Inside of the cold plate 159, the cold plate entry tube 197 is then split into multiple serpentine circuits 109, four in this preferred embodiment, that make several passes within the cold plate 159 to ensure adequate length is available for the heat transfer rates and the expected flowrates. The serpentine circuits 109 are then manifolded to a rear header pipe 111. The rear header pipe 111 then connects to a pair of orifice supply pipes 112, each of which connects to an orifice housing 258 located on the back side of the carbonator tank 161 and the cold plate 159.

In this preferred embodiment, the orifice housing 258, having a first side 259 and a second side 286, is permanently mounted to the carbonator tank 161, such that the second side 286 mates with a water stream entry port 287 of the carbonator tank 161. The orifice housing 258 contains a first aperture 260 passing from the first side 259 through to the second side 286. The first aperture 260 aligns with the entry port 287 of the carbonator tank 161. The first aperture 260 has two different diameters, a plug diameter 261 and an orifice diameter 262, each of which is threaded. The orifice housing 258 has a second aperture 263 to accept the orifice supply pipe 112. The second aperture 263 passes from an outer surface 288 through to the first aperture 260.

A removable fitting 264, having an orifice 265, a major diameter 267 and a minor diameter 266, fits inside of the first aperture 260 of the orifice housing 258, wherein the external threads of the minor diameter 266 engage the internal threads of the orifice diameter 262 to secure the removable fitting 264 inside of the orifice housing 258. The orifice 265 therein aligns with the entry port 287 and the first aperture 260 of the orifice housing 258. A slot 268 is located on the top surface of the removable fitting 264 for installation and removal with a screwdriver. A plug 269, having a threaded portion 271 and a flange 272, is used to seal off the carbonated water circuit 163 by mating the external threads of the threaded portion 271 to the internal threads of the plug diameter 261 of the first aperture 260 of the orifice housing 258. The fluid path is sealed through the use of an o-ring 270 and an o-ring groove 273 in the flange 272 of the plug 269.

Figure 2A:
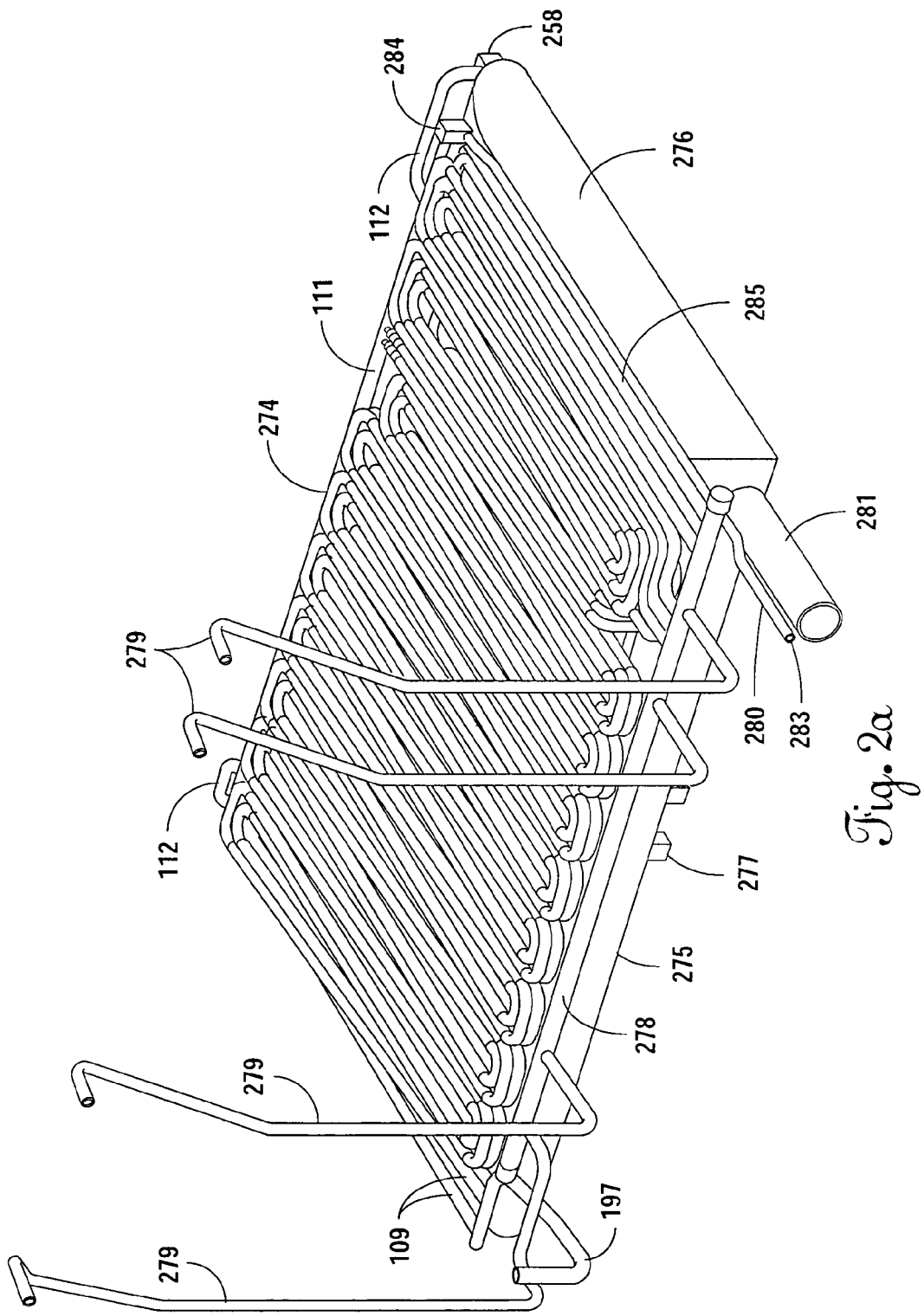
FIG. 2a provides an isometric view of a carbonated water circuit.
Figure 2B:
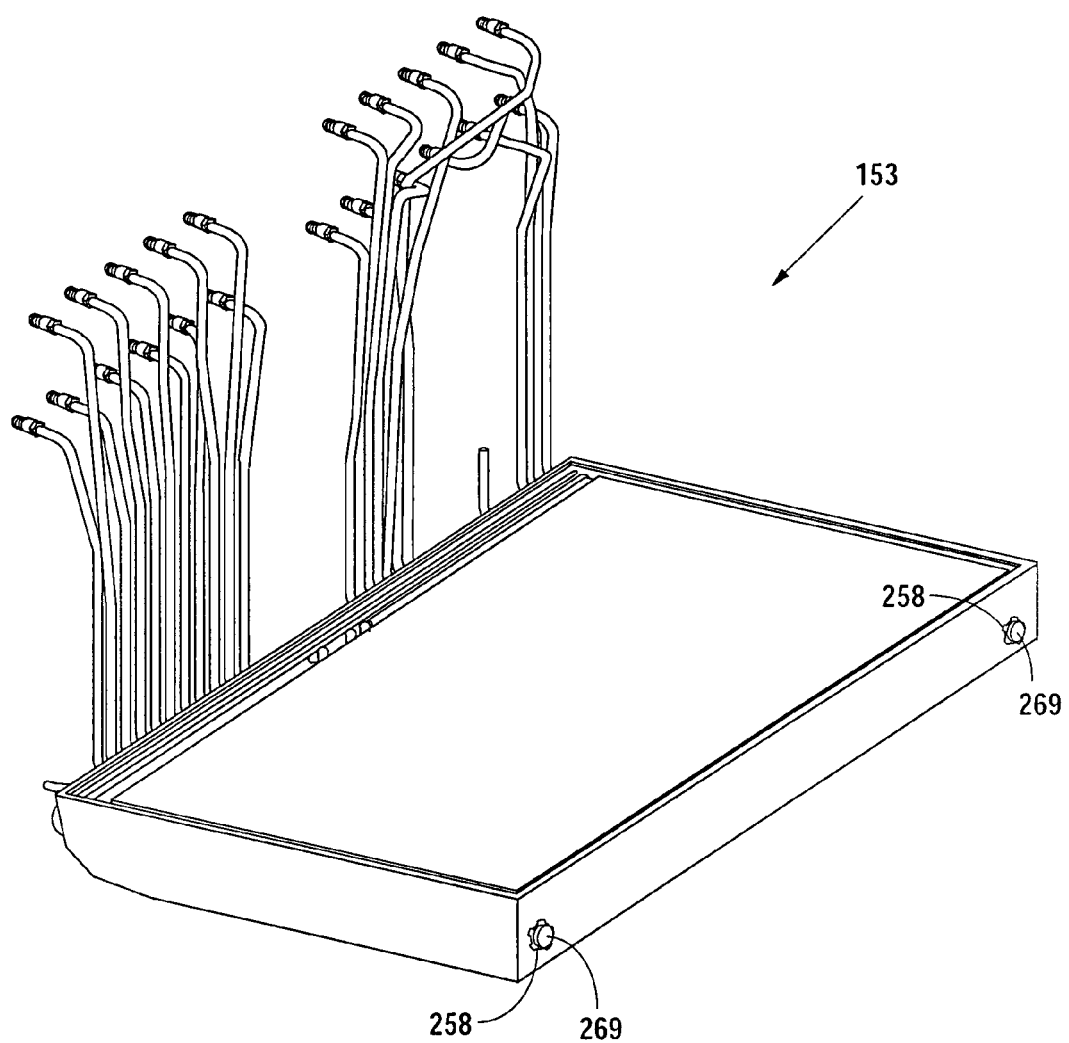
FIG. 2b provides an isometric view of the rear side of a cold plate assembly according to the preferred embodiment.
Figure 2C:
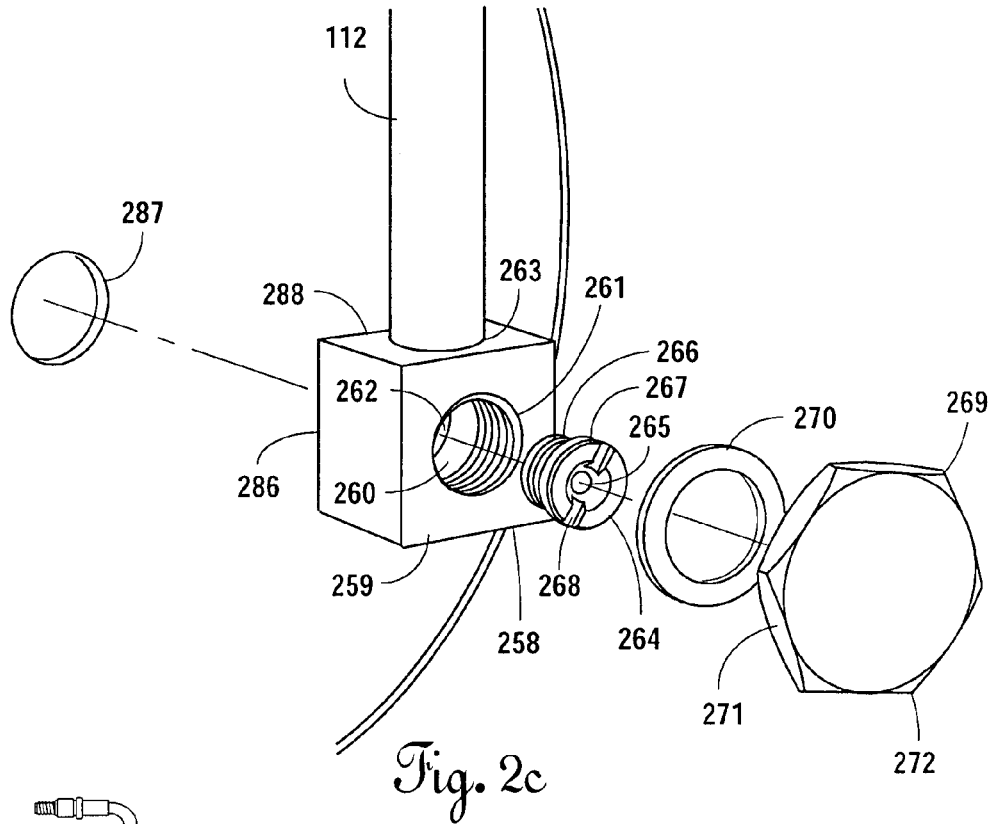
FIG. 2c provides an exploded view of an orifice housing according to the preferred embodiment.
Figure 2D:
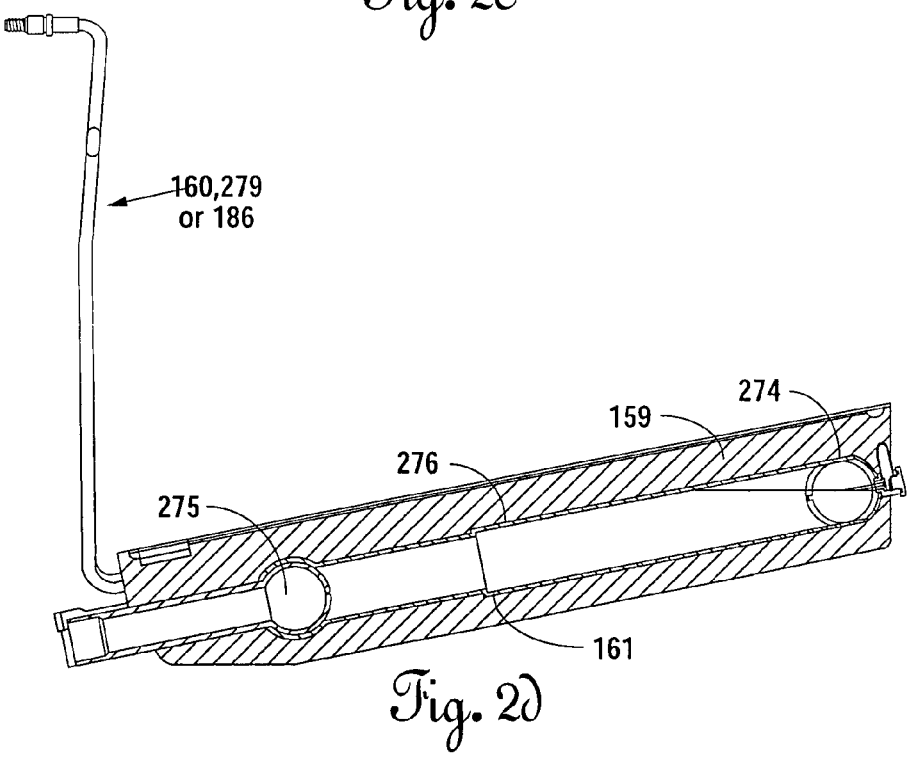
FIG. 2d is a cross section view of the cold plate assembly.
Figure 2E:
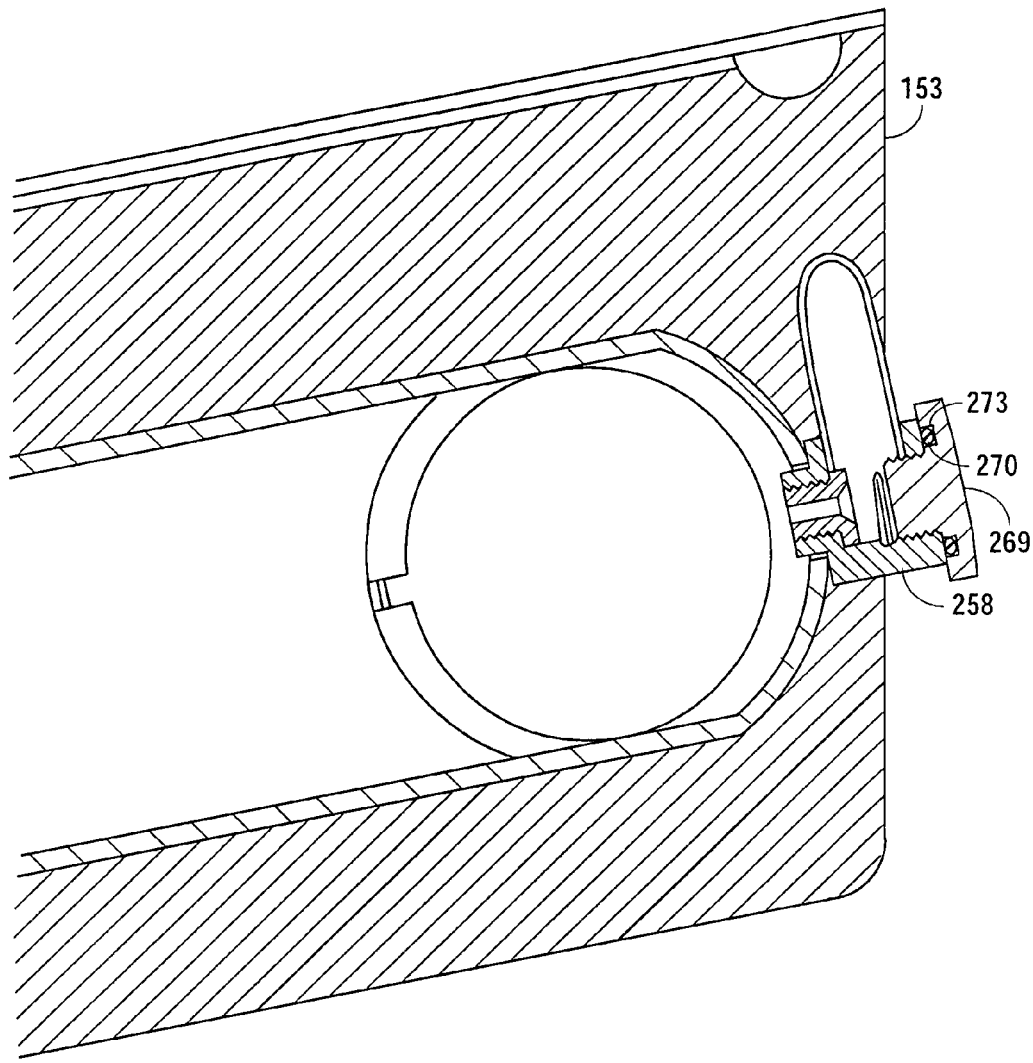
FIG. 2e is a detail view of the orifice housing.
Figure 2F:
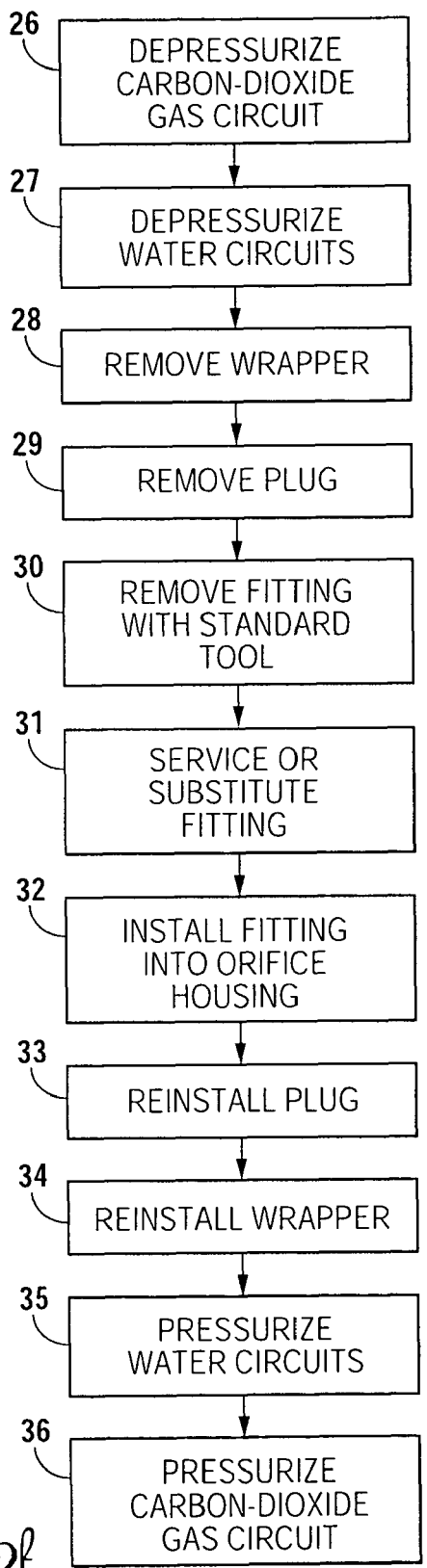
FIG. 2f is a method flowchart for removing the carbonator orifices.
Figure 2G:
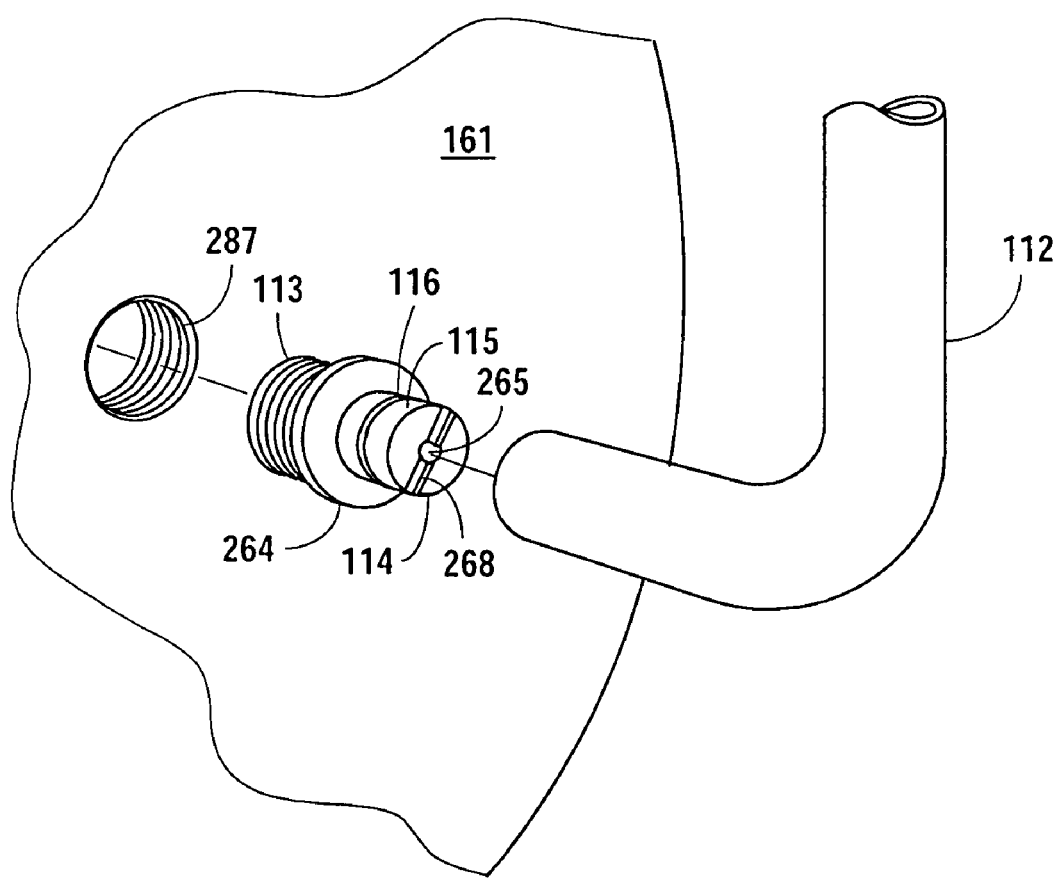
FIG. 2g is a detail view of removable fittings according to a second embodiment.

It should be clear to one skilled in the art that variations of this embodiment may exist, including an embodiment wherein the fitting 264 is removably attached to the entry port 287 of the carbonator tank 161. In the simplest embodiment, as shown in FIG. 2g, a carbonator tank 161 includes an entry port 287 having internal threads, a fitting 264 having a first end 113 and a second end 114, and an orifice supply pipe 112. The first end 113 of the fitting includes external threads suitable for mating with the internal threads of the entry port 287. The second end 114 of the fitting 264 includes a protrusion 115 for mating with the orifice supply pipe 112. Sealing may be accomplished through the use of an o-ring 116 or a flare connection. Various methods of mechanical restraint known to those skilled in the art may be employed to secure the orifice supply pipe 112 to the fitting 264, such as flare nuts, or the like. This arrangement allows water to be carbonated to flow from the orifice supply pipe 112, and through the orifice 265 of the fitting 264 to enter the carbonator tank 161.

In this preferred embodiment, the fittings 264 are removable and replaceable. Removal of the fittings 264 may be necessary in a carbonator tank 161 tuning situation, such as a high altitude environment, abnormally high or low ambient water temperature or obstruction of the orifice 265. Changing of the orifice 265 size can have a dramatic effect on in-line carbonation, and ultimately, in-cup carbonation. Removable fittings 264 are important in an integrally cast in place carbonator tank 161, as the failure of the carbonator tank 161 in an integral unit could result in catastrophic failure of the dispenser 100.

Removal of the fittings 264 for adjustment or servicing is completed from the rear of the dispenser 100. As shown in FIG. 2f, the removal procedure commences with depressurizing the carbon-dioxide circuit, step 26. Next, step 27, the water circuits are depressurized. The wrapper 164 must be removed from the dispenser 100 to access the plug 269 as shown in step 28. The removal procedure continues with removal of the threaded plug 269 from the orifice housing 258 with the use of either a wrench or standard tool as shown in step 29. Once the plug 269 is removed, the fitting 264 may be removed from the orifice housing 258 by placing a screwdriver in the slot 268 and turning the orifice housing counter-clockwise, step 30. At this point, the fitting 264 may be either substituted or cleaned, step 31. Upon substitution or cleaning, the fitting to be used is installed as shown in step 32. Next, step 33, the plug 269 is installed. Installation of the plug 269 should include the use of teflon tape or thread sealant to ensure no leaks are present in the pressurized circuit. The service agent may now reinstall the wrapper 164, step 34. After installation of the wrapper 164, the water circuits may be pressurized, step 35. The final step, step 36, includes pressurizing the carbon dioxide gas circuit.

From the orifice housing 258, water to be carbonated passes through the removable fitting 264 into the carbonator tank 161. The carbonator tank 161 is disposed in the cold plate 159. The carbonator tank 161 includes a top pipe 274, a bottom pipe 275 and two side pipes 276, all of which are hollow. The ends of the pipes 274, 275 and 276 are connected together to form a hollow rectangular structure. The carbonated water circuit 163 further includes a pair of carbonated water outlets 277, a post-chill circuit having a serpentine coil 285, a post-chill manifold 278, and a carbonated water riser tube 279 for each dispensing valve 177. After carbonation, the carbonated water exits the carbonator tank 161 through the two carbonated water outlets 277 and enters the post-chill manifold 278. From the post-chill manifold 278, the carbonated water enters the carbonated water riser tubes 279. The riser tubes 279 extend upward, connecting to the backblocks 176. The backblocks 176 connect to the dispensing valves 177, therein completing the carbonated water circuit 163.

The carbonator tank 161 further includes a gas inlet pipe 280, a guide tube 363, a probe fitting 281 and a probe assembly 282. A first end 283 of the gas inlet pipe 280 is connectable to a carbon-dioxide supply. A second end 284 of the gas inlet pipe 280 is connectable to the top pipe 274 of the carbonator tank 161 to feed carbon-dioxide gas to the top pipe 274 of the carbonator tank 161. The gas side of the carbonator system is pressurized to approximately seventy to eighty pounds per square inch. The guide tube 363 is rigidly mounted within the carbonator tank 161, and is coaxial with the probe fitting 281, therein providing the probe assembly 282 with a location to enter the interior of the carbonator tank 161 and take resistance measurements in the carbonator tank 161. The guide tube 363 is open on both ends to allow water and carbon dioxide to flow in either direction. The guide tube 363 further includes a plurality of drain/fill ports 370 to minimize uneven draining between the drain tube 363 and the carbonator tank 161. The probe fitting 281, having a first inner diameter 341 and a second inner, diameter 342, is designed to accept the probe assembly 282.

In the preferred embodiment, the resistance measurements taken by the probe assembly 282 are used by a microcontroller to discern between the presence of liquid or gas at the sample point. The probe assembly 282 includes a fitting end 294 and a probe tip end 295. The fitting end 294 includes a probe body 296, a pair of o-rings 297, an insulator 343, a reference wire 344, a probe wire 345 and a probe 353. The probe body 296 is of a conductive material. In this preferred embodiment, the probe body 296 is made of stainless steel. The probe body 296, having a shape complementary to the probe fitting 281, also includes a pair of o-ring grooves 347 on an outer body diameter 348 for receiving the pair of o-rings 297. The probe body 296 further includes a pocket 349 for engaging the reference wire 344, wherein the reference wire 344 is in direct contact with a perimeter 350 of the pocket 349. The probe body 296 further includes a full depth diameter 351 that engages a chamfer 352 between the first inner diameter 341 and the second inner diameter 342 of the probe fitting 281. The probe 353 extends through the probe body 296 axially in the installed position. The insulator 343 is disposed around the probe 353 in the probe body 296, such that the probe 353 is electrically isolated from the probe body 296. The probe 353 is further covered by an insulation 354, extending to the probe tip end 295, however, a probe tip 355 is exposed. The probe tip end 295 includes the probe tip 355, a second insulator 356 and the insulation 354. The second insulator 356 centers the probe tip 355 in the guide tube 363.

On assembly, the probe tip end 295 of the probe assembly 282 is inserted into the guide tube 363 of the probe fitting 281. The outer body diameter 348 of the probe body 296, then slides into the first inner diameter 341 of the probe fitting 281, and then slides into the second inner diameter 342 of the probe fitting 281 until the full depth diameter 351 engages the chamfer 352 between the first inner diameter 341 and the second inner diameter 342 of the probe fitting 281. The first inner diameter 341 further includes an internal thread 357 for engaging a probe retaining nut 298 having an external thread 358.

Once the dispenser 100 is assembled, the cold plate assembly 153 and the carbonator tank 161 are at a ten degree angle from the horizontal. In this position, the water level at the probe tip 355 represents a low level fill line 359. A high level fill line 360 is derived by running the carbonator pump 170 for a predetermined amount of time, in this preferred embodiment, five point four seconds, after the water level reaches the probe tip 355. The amount of carbonated water below the low level fill line 359 is known as a reserve volume 361. The high level fill line 360 dictates a maximum fill. The volume between the high level fill line 360 and the low level fill line 359 is known as a stroke volume 365. The volume above the high level fill line 360 is known as a head volume 362. The head volume 362 is filled with carbon-dioxide gas.

Figure 3:
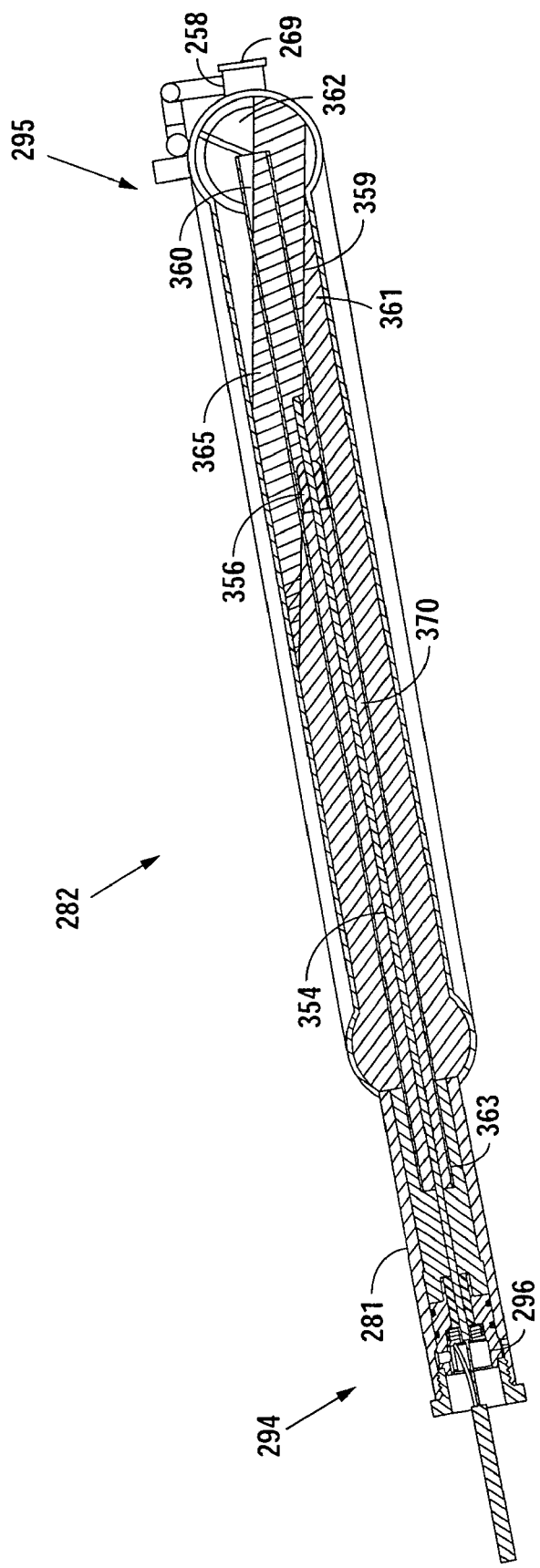
FIG. 3 provides a cross section of a monoprobe assembly according to the preferred embodiment.
Figure 3A:
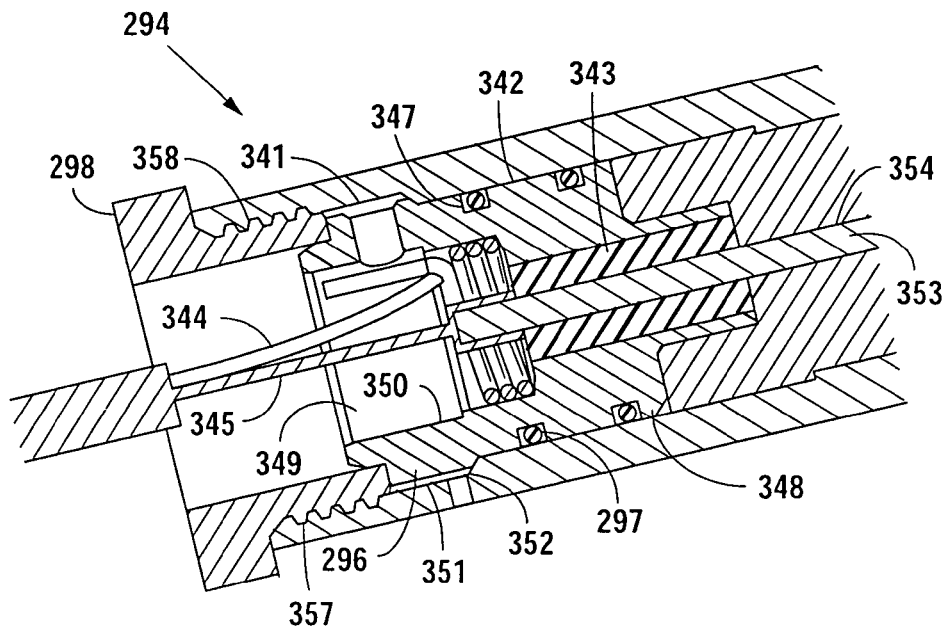
FIG. 3a provides a detail view of the monoprobe cross section view.
Figure 3B:
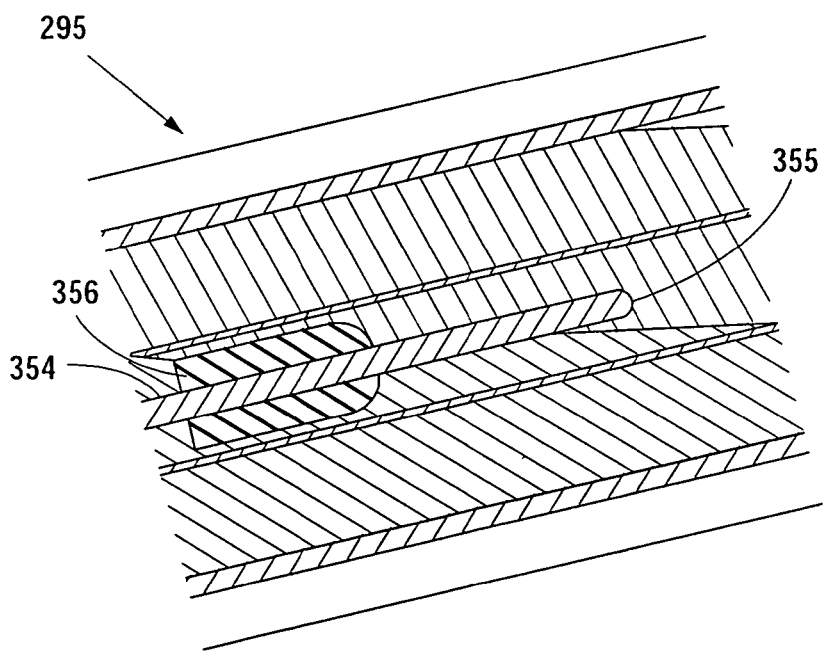
FIG. 3b provides a detail view of a probe tip.
Figure 3C:
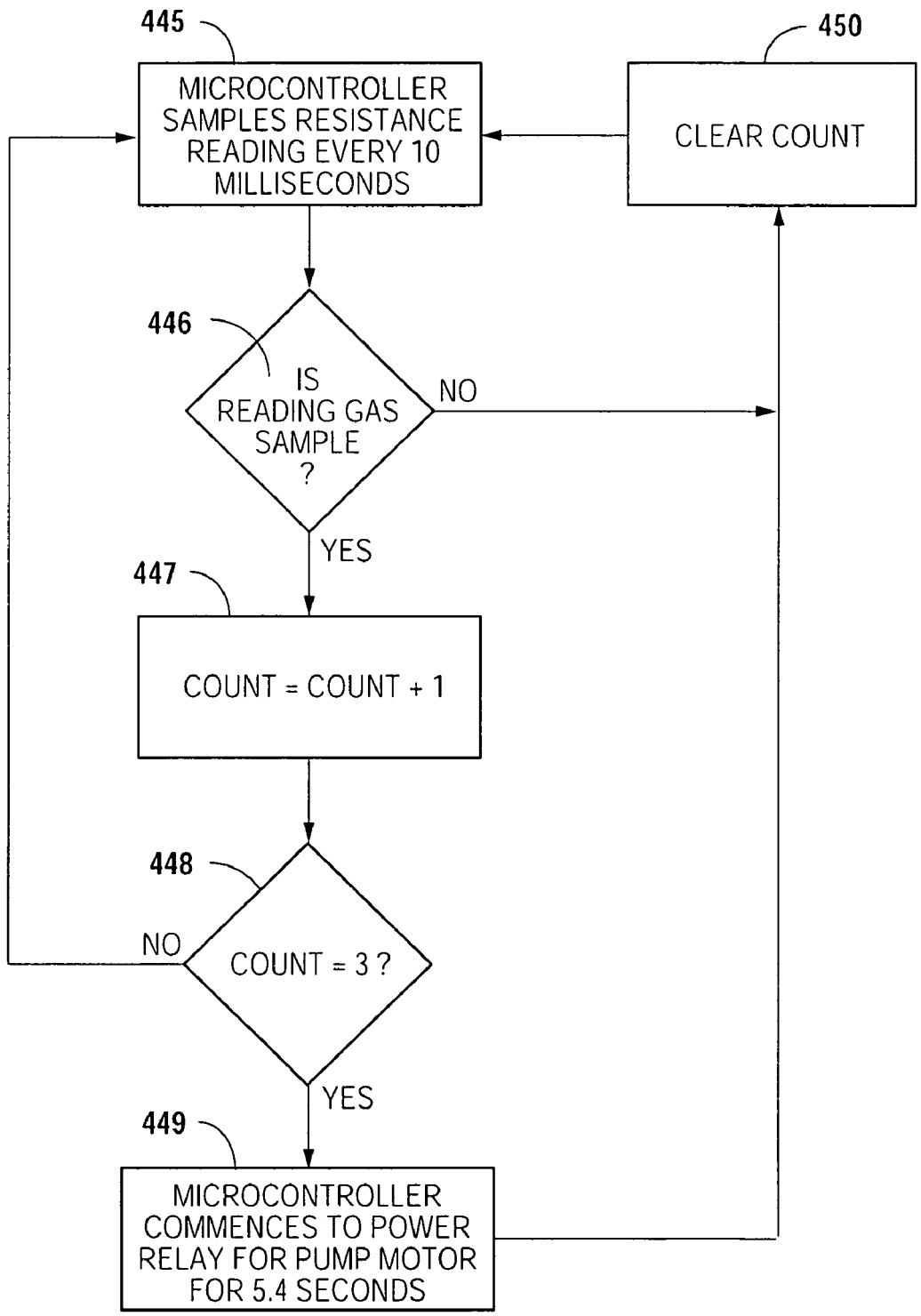
FIG. 3c is a method flowchart of the operation of the monoprobe in the preferred embodiment.

FIG. 3c provides the operations of the probe under normal conditions. As shown in step 445, the microcontroller samples the resistance measurements taken between the ground wire 344 and the probe tip 355 at a predetermined interval, in this preferred embodiment, every ten milliseconds. The microcontroller has a registry of resistance values associated with a gas reading (carbon dioxide) and a liquid (carbonated water) reading. Once a gas reading is obtained, the microcontroller proceeds to step 446, where the next sample is analyzed to determine if it also is a gas reading. If the sample is also a gas reading, the microcontroller proceeds to step 447, where a counter is increased by one. The microcontroller proceeds to step 448, where the count is analyzed to determine if three consecutive gas samples have been obtained. If the three samples are gas readings, then the microcontroller proceeds to step 449, wherein the microcontroller provides power to a relay that activates the carbonator pump motor 171 for five point four seconds. The microcontroller then clears the count, step 450, and returns to step 445 where it continues to monitor the resistive measurement samples. If there are not a gas reading in step 446, then the microcontroller proceeds to step 450 for clearing the Count, and then on to step 445, where it continues to monitor the resistive measurement samples. Use of this process minimizes the chance of erratic readings due to splashing or entrapped bubbles.

In summary, the carbonated water circuit 163 begins as uncarbonated water coming from a water source. Water enters into the inlet tube 173, moves into the inlet port 168 of the carbonator pump 170 where it is pressurized to approximately one hundred and twenty pounds per square inch. The water then moves out of the outlet port 169 of the carbonator pump 170, into the pump outlet tube 194 and into the inlet of the check valve 195. Once past the check valve 195, the water cannot travel backwards to contaminate a water supply. The water then exits the check valve outlet port 253, goes through the extension tube 196 and enters the cold plate entry tube 197 located in the cold plate assembly 153. Once inside of the cold plate 159, the water is split into four serpentine circuits 109, brought back to two tubes 110 and into the rear header pipe 111. Once in the rear header pipe 111, the water is forced into the orifice supply pipes 112 and into the orifice housing 258 where it is forced through the removable fittings 264 and into the part of the carbonator tank 161 pressurized with carbon-dioxide. The water is then carbonated, and settles to the bottom of the carbonator tank 161. Upon demand, the carbonated water is drawn through the outlet tubes 277 and enters the serpentine coils 285 of the post-chill circuit. The carbonated water then enters the post-chill manifold 278 and is then distributed to the carbonated water riser tubes 279 leading to the dispensing valves 177. From the riser tubes 279, the carbonated water passes through the backblocks 176 to the dispensing valves 177 for consumption.

In this preferred embodiment, the carbonator pump assembly 154 is mounted inside of the dispenser 100 in previously unrecoverable cooling volume. The mounting location is accessible from the front 105 of the dispenser 100. The carbonator pump assembly 154 includes a pump 170, a motor 171 and a bracket 167. The bracket 167 includes a plurality of threaded studs 289, and is connectable to a motor mounting bracket 292. The studs 289 pass through a hole pattern in the motor mounting bracket 292 and are secured with a washer 290 and a locknut 291. The bracket 167 connects to the dispenser housing 150 with a set of four screws 166. Mounting the carbonator pump assembly 154 inside of the dispenser 100 volume minimizes the quantity of hoses that must be plumbed in a dispenser installation. With an integral carbonator pump assembly 154, only a single water source line needs to be plumbed for the carbonated water circuit 163. Further advantages include the elimination of finding an external power source for a remote carbonator or the necessity to run a power line from a dispenser to a remote carbonator. In the integrated carbonator 161 scheme, the carbonator pump assembly 154 receives power directly from the dispenser 100.

While this preferred embodiment has been shown with a carbonated circuit 163 and an integral carbonator pump assembly 154, it should be clear, to one skilled in the art, that the dispenser 100 may be outfitted to dispense uncarbonated drinks or a mixture of both carbonated and uncarbonated. In the case of uncarbonated drinks, the dispenser could be outfitted with a boost pump. Integration of the boost pump into the dispenser provides cost benefits, as well as installation benefits. In cases where both carbonated and uncarbonated drinks are served, the dispenser may require both a boost pump and a carbonator pump. In cases where abnormally low or erratic water pressures exist, the dispenser will further require a boost pump and/or an accumulator.

Figure 4:
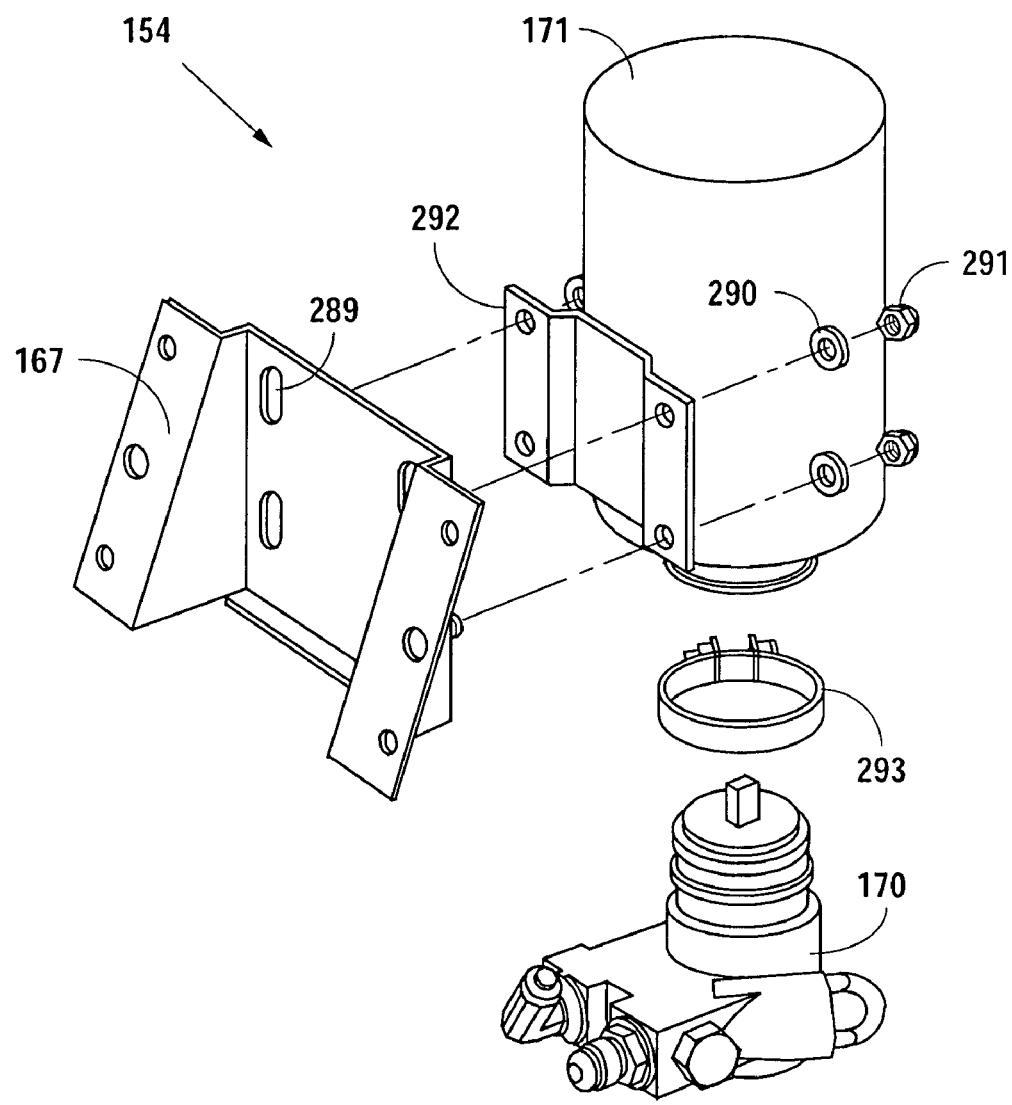
FIG. 4 provides an isometric view of a carbonator pump assembly according to the preferred embodiment.
Figure 4A:
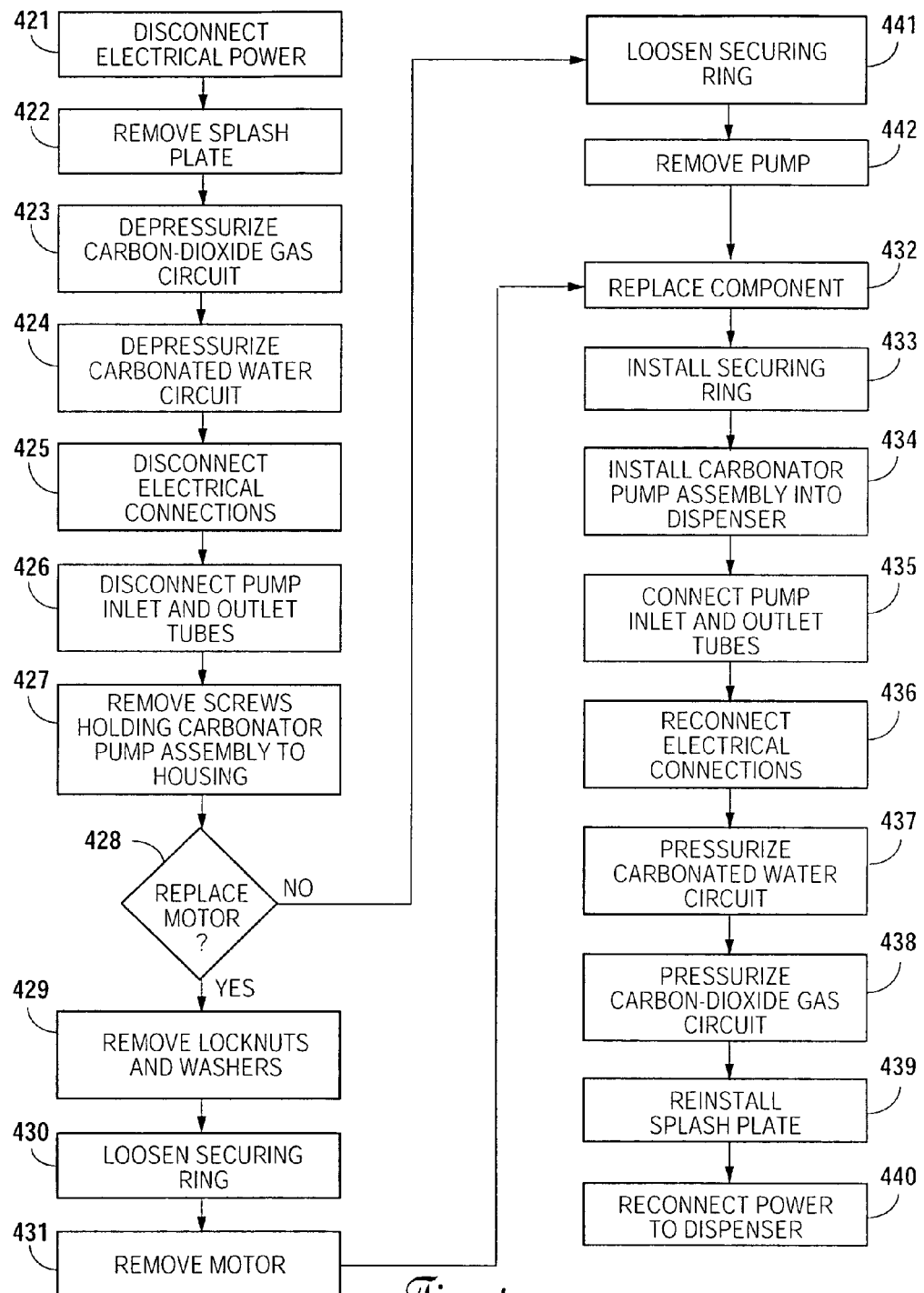
FIG. 4a is a method flowchart for the removal of the carbonator pump assembly according to the preferred embodiment.
Figure 5:
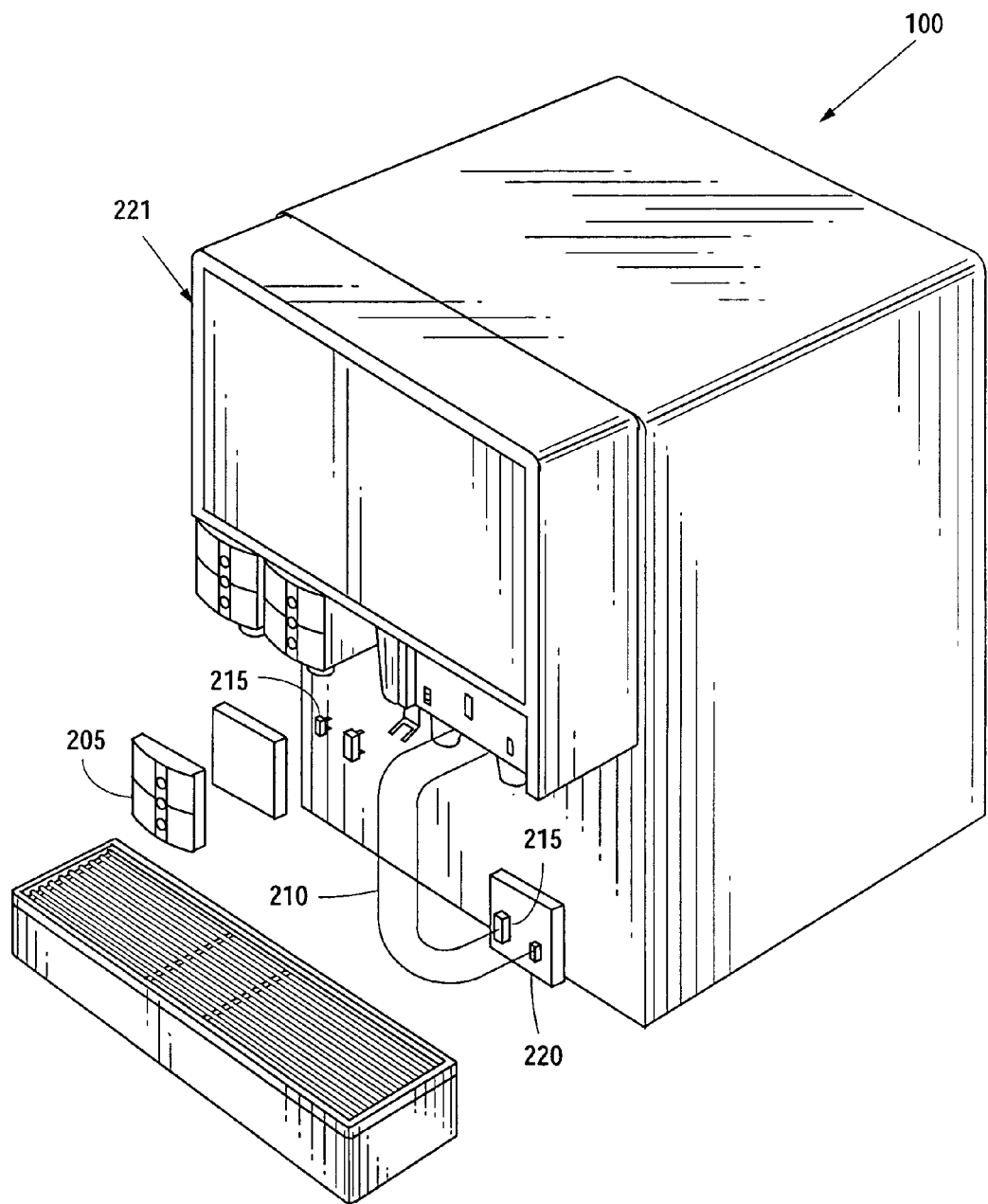
FIG. 5 provides an exploded view of the touch panel and related connections.

Removal of the carbonator pump assembly 154 is accomplished from the front 105 of the dispenser 100, therein simplifying servicing of the dispenser 100. As shown in FIG. 4a, removal of the carbonator pump assembly 154 commences with step 421, disconnecting the electrical power to the dispenser 100. The next step, step 422 includes removing the splash plate 152. The service agent must then depressurize the carbon-dioxide lines as shown in step 423. Next, step 424, the carbonated water circuit 163 is depressurized. Electrical connections may now be disconnected, step 425. The pump inlet tube 173 may now be disconnected from the pump inlet 168 and the pump outlet tube 194 may now be disconnected from the pump outlet 169 as shown in step 426. In step 427, the four screws 166 holding the carbonator pump assembly 154 to the dispenser housing 150 are removed, therein separating the carbonator pump assembly 154 from the dispenser 100.

At this point, step 428, either the motor 170 or the pump 171 are serviceable. In order to remove the motor 170, the service agent proceeds to step 429, and removes the locknuts 291 and washers 290 from the carbonator pump assembly 154. Next, the service agent must loosen the securing ring 293 as shown in step 430, therein freeing the motor 170 from the carbonator pump assembly 154 as shown in step 431. If the service agent desires to replace the pump 171 after removing the carbonator pump assembly 154 from the dispenser 100 in step 427, the agent would then proceed to step 441 and loosen the securing ring 293, therein freeing the pump from the assembly as shown in step 442.

The serviced component or new replacement must be mated to the old assembly, step 432, and the securing ring 293 is tightened as shown in step 433. Step 434 includes installing the serviced carbonator pump assembly 154 into the dispenser 100 with the four screws 166. The pump inlet tube 173 and the pump outlet tube 194 are installed in step 435. Electrical connections to the carbonator pump assembly 154 may now be reconnected, step 436. The carbonated water circuit 163 is then pressurized as shown in step 437, and the carbon-dioxide circuit is pressurized as shown in step 438. The final steps, step 439 and 440, call for reinstalling the splash plate 152 and reconnecting the electrical power to the dispenser 100, respectively.

The dispenser 100, in this preferred embodiment, uses a touch panel assembly 200 for each valve. In this preferred embodiment, there are four multi-flavor nozzles and four touch panel assemblies 200. The touch panel assemblies 200 are removable and are connected to the dispenser 100 through two harnesses 210. The harnesses 210 and connectors 215 connect the touch panel assembly 200 to an interface panel 220 located underneath a merchandiser 221. The touch panel assembly 200 is restrained from movement through the use of four fasteners and the working area of the touch panel assembly 200 is defined by a bezel 205.

The touch panel assembly 200 includes a back panel 301, a valve board 311, a light separator/reflector 340, an electrode board 321, a front panel 331 and decals 334 as shown in FIG. 6. The back panel 301 is an injection molded part having a bottom surface 302, snap features 305, screw mounts 304 and four sides 303 producing an enclosure for valve board 311. The valve board 311 is a printed circuit board 319 outfitted with a microcontroller 312, sensing chips 313, LEDs 314 and harness connectors 315. The light separator/reflector 340 is an injection molded piece that fits between the valve board 311 and the electrode board 321. Tile light separator/reflector 340 is designed to separate the light streams from each of the LED 314 groups, and provide definitive lines between lit and unlit areas of the user interface 333. Upon installation, the valve board 311 is mounted on the interior portion of back panel 301 with foul screws 316 through mounting holes 317. Harness connections 315 for connectors 215 are configured such that they pass through the bottom surface 302 of back panel 301.

The electrode board 321 is a thin fiberglass board which houses the electrode traces 323 of the touch panel assembly 200. The front panel 331 is an injection-molded part having a user interface panel 333 and snap features on the outer sides 335. The electrode board 321 mounts near inner surface 332 of the front panel 331 to ensure close proximity to the user interface panel 333. The electrode board 321 has an electrical connection 322, which attaches to the valve board connection 318 for switch activation signals. Upon assembly, the front panel 331 and the electrode board 321 are an integral unit. The electrical connection 322 must be attached to the valve board connection 318 prior to mating the front half of the unit to the back panel 301 housing the valve board 311. Once connections have been made, the front panel 331 may be snapped onto the open portion of back panel 301 using snap features 305 and 335 to form one touch panel assembly 200. Decals 334 must be installed on the touch panel assembly 200 before the bezel 205 is installed.

In the assembled form of touch panel assembly 200, LED's 314 located on valve board 311 are located behind electrode board 321. In this position, once powered up, the LEDs 314 are visible from the user interface 333 side of the touch panel assembly 200. The LED 314 light passes through the light separator/reflector 340 and the thin yellow fiberglass electrode board 321, which appears clear during viewing by a consumer. Other electrode board materials may be used, including clear or translucent mylar, and/or indium-tin oxide (ITO). Fiberglass was chosen for the preferred embodiment because it is readily available, inexpensive, and because it acts as a diffuser, masking the traces. The LED's 314 provide a low cost, easily available source for valve specific lighting. In operation, the LED's 314 can provide a visual draw to the valve or dispenser by flashing or turning on and off in a prescribed routine. Illustratively, the microcontroller 312 may include instructions that activate the LED's in at a prescribed time and in a prescribed sequence to attract consumers to the dispenser 100. Further deviations of this attribute may include a proximity sensor to trigger the activation of a lighting sequence or display, when a field of the proximity sensor is penetrated.

Figure 6A:
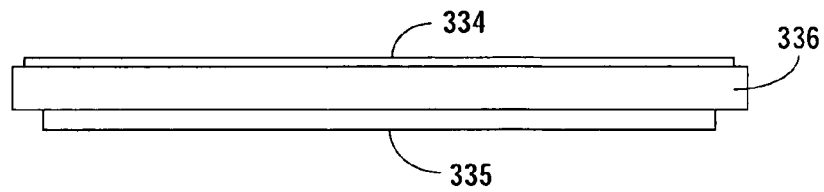
FIG. 6a provides an unlit touchpad embodiment.

While this preferred embodiment has been shown as a lighted dispenser 100, an unlit embodiment may be achieved by not outfitting the dispenser with LEDs 314, or using all alternate method of mounting a circuit panel 335. As shown in FIG. 6a, a circuit panel 335 may be mounted in an opaque molded plastic housing 336 with a label 334. The alternate arrangement provides a method of minimizing the number of components and manufacturing costs associated with lighted dispensers.

Figure 6B:
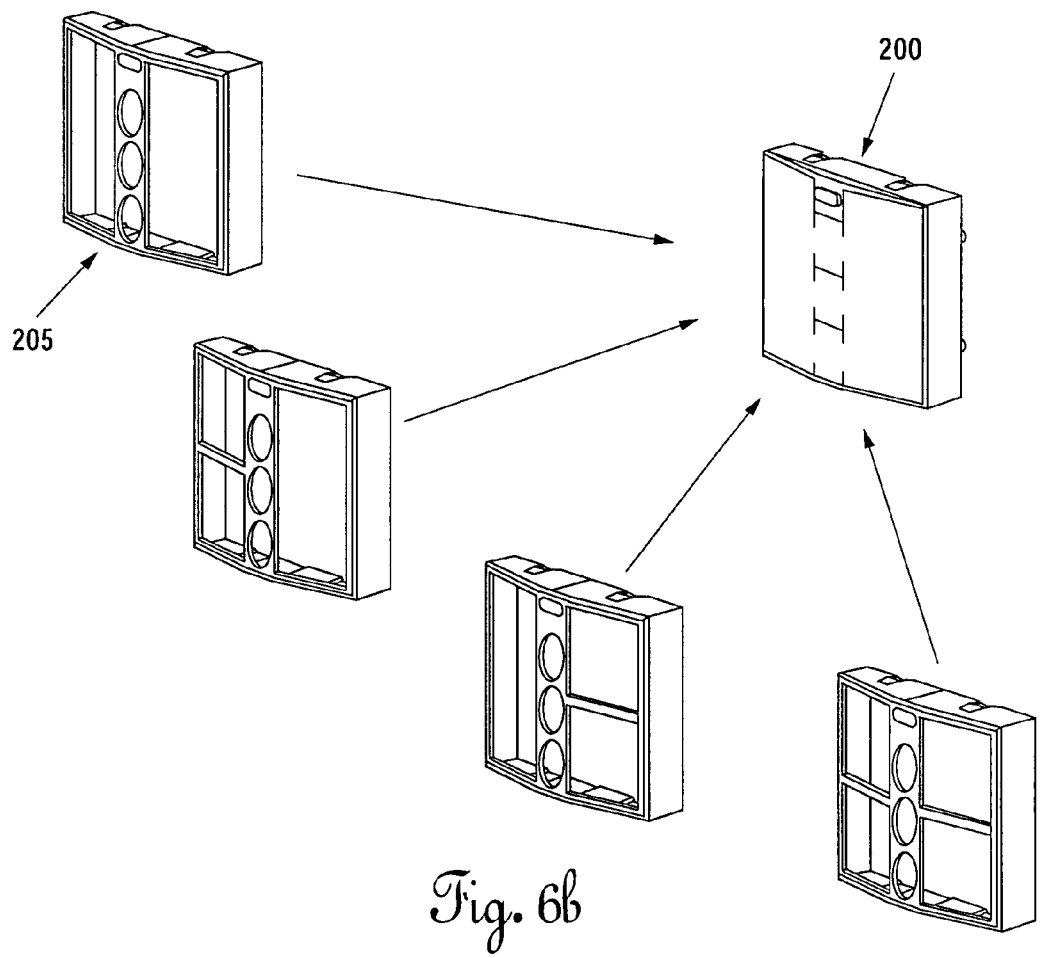
FIG. 6b provides an overview of the different bezel configurations.

The assembled touch panel assembly 200 can now be snapped into a bezel 205. The addition of the bezel 205 further defines the working area of the user interface panel 333. Bezel 205 configurations can vary with changing products and additives such as flavorings. FIG. 6b provides a sample of bezel 205 configurations for the touch panel assembly 200 for dispenser 100. These examples can support either a 2, 3, or 4 brands with up to three additional additives.

Figure 7:
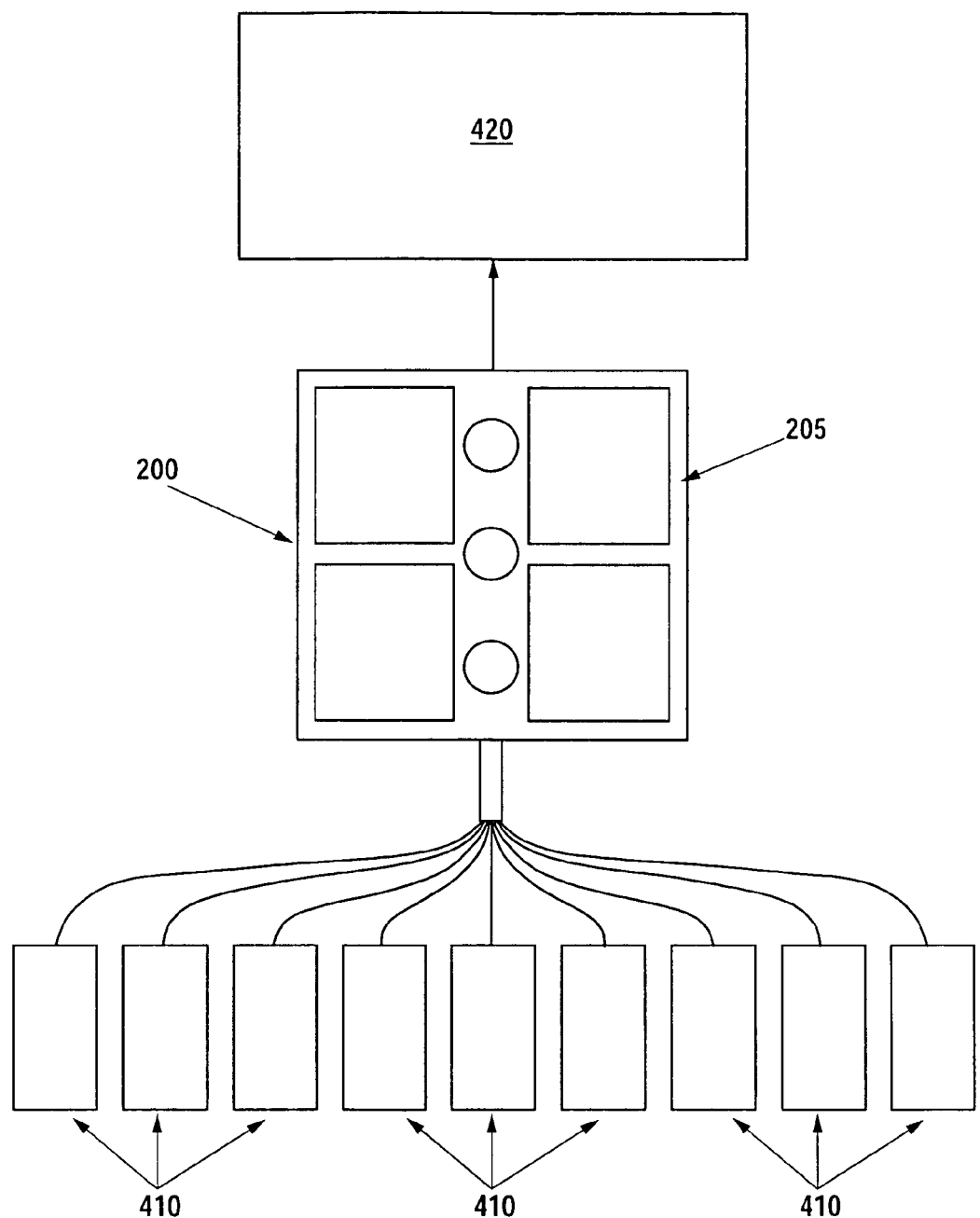
FIG. 7 illustrates the relationship of the switch module to the solenoids and power supply.

The touch panel assembly 200 is an independent device capable of controlling solenoids separately or simultaneously. All driving Field Effect Transistors (FET's) are part of the touch panel assembly 200; therefore the touch panel assembly 200 is controlling the solenoids. FIG. 7 provides a diagram showing connection of the touch panel assembly 200 with a bezel 205 to power supply 420 and solenoids 410. Power supply 420, in this preferred embodiment, supplies 24 VDC voltage to drive the solenoids 410, and also, if required, a 16 VDC power supply may be employed to drive the LED's 314. Multiple touch panels 200 could be operated through the power supply 420 only if no other control between touch panels 200 was desired, such as synchronized lighting, and/or limiting the number of valves in simultaneous operation to be disclosed in later paragraphs.

Up to nine solenoids 410 can be operated by touch panel assembly 200 on dispenser 100 as follows: 4 brands, 3 bonuses, 1 soda (sparkling water) solenoid 410, and 1 plain water (soft water) solenoid 410. Touch panels 200 can operate 6 solenoids 410 simultaneously, including 1 brand, up to 3 bonuses, and both the soda and plain water solenoids 410, to yield a "mid-carb" drink. In most cases, however, only one or two bonuses flavor solenoids 410 would be used with one brand and either one of the water solenoids 410. Use of this system provides a means for a very simple one or two nozzle beverage dispensing unit, including up to eight brands and 6 bonus flavors, which is powered by a power supply 420. The extra cost and complexity of having a multi nozzle controller board is then eliminated.

Figure 8:
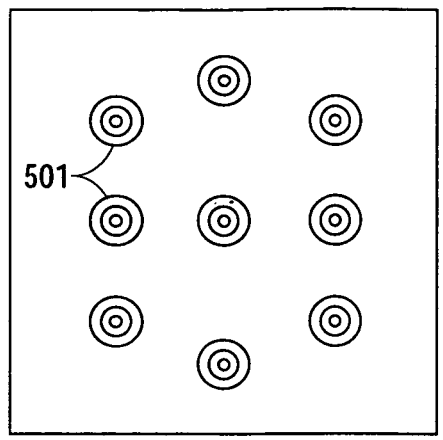
FIG. 8 provides an overview of touch pad locations.

The dispenser 100 uses touch panel assemblies 200 to sense a touch on the panel and then to activate product valve solenoids 410 for soft drink dispensing. The touch panel assemblies 200 are approximately 5"×5" in size, and have nine distinct touch areas 501 to allow for independent activation shown in FIG. 8. The touch areas 501 are defined by the placement of seven sets of traces 502 on the electrode board 321. In this preferred embodiment, there is one sensing chip per trace 502; however, there are chips available that can control multiple traces 502. When activated, the traces 502 produce electrode "sensing" fields 505 as shown in FIG. 8a. Sensing fields 505 beyond the seven are obtained through overlapping the electrode "sensing" fields 505 as shown in FIG. 8a to produce the eighth and nine electrode "sensing" fields 506 and 507 to provide greater flexibility in configuration of the user interface 333.

Figure 8B:
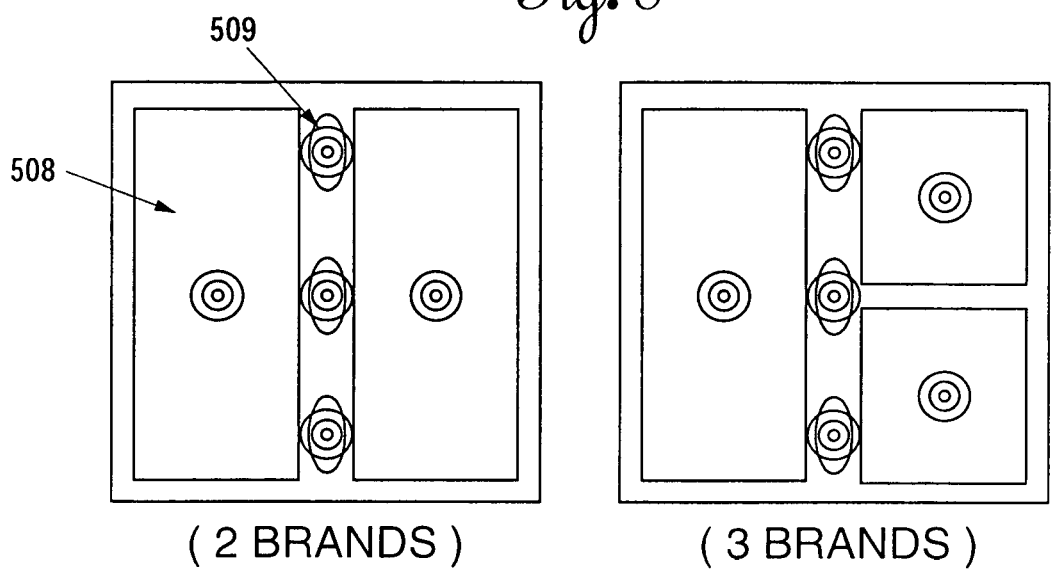
FIG. 8b shows a layout of the user interface areas on a touch panel assembly.
Figure 8B:
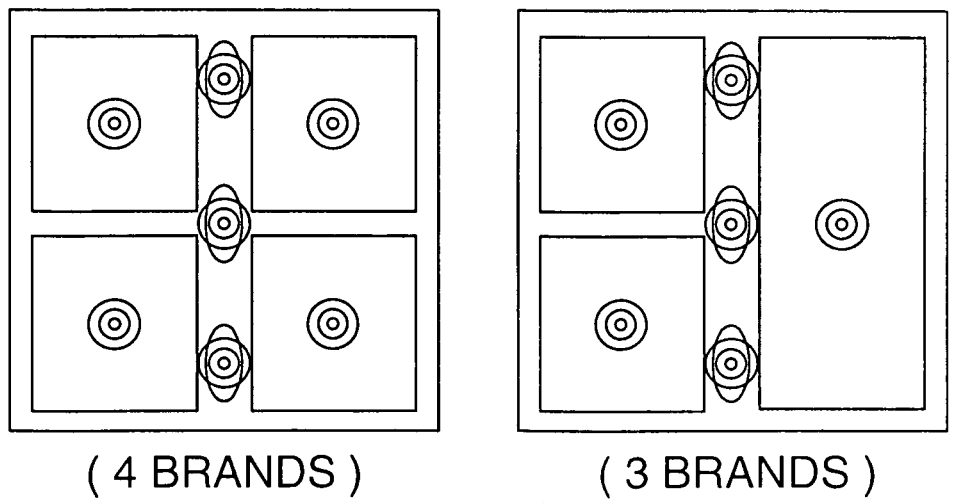
Figure 8C:
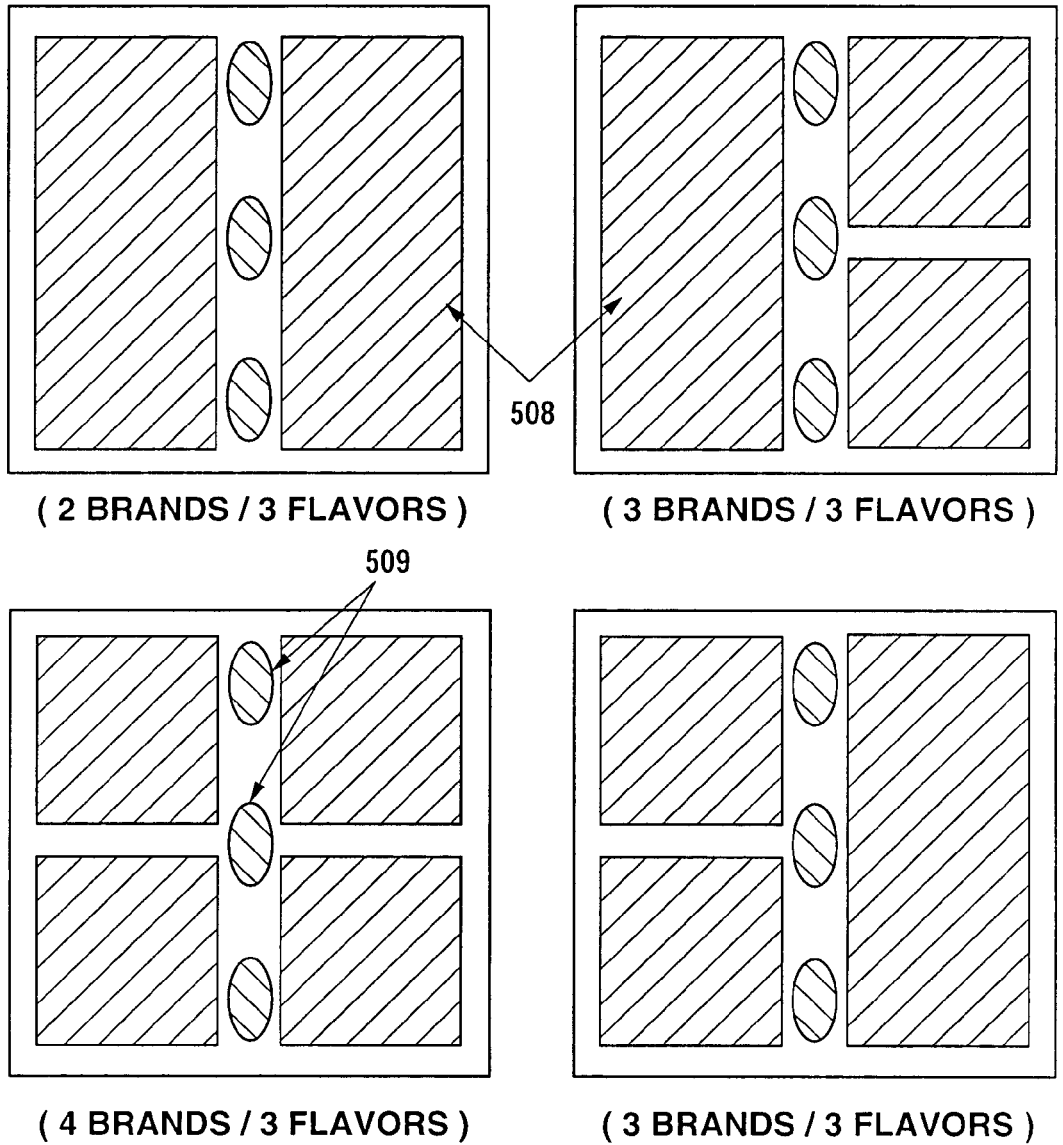
FIG. 8c illustrates the flavor configurations that are supported by the preferred embodiment.
Figure 9:
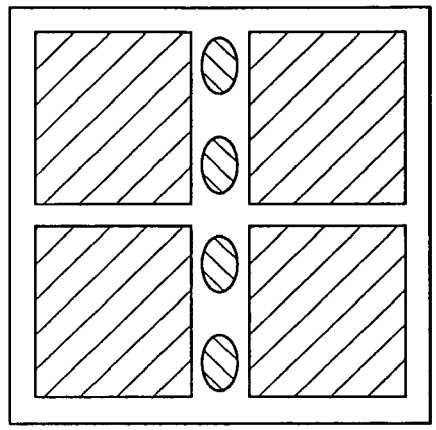
FIG. 9 shows other possible touch pad configurations.
Figure 9:
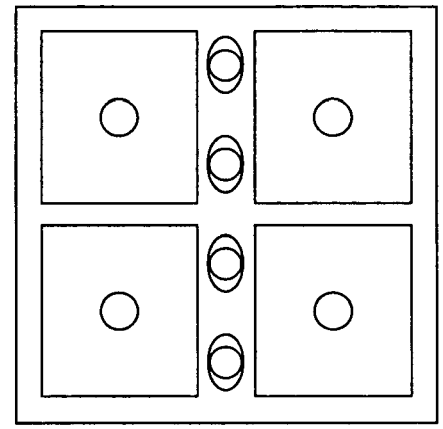
Figure 9:
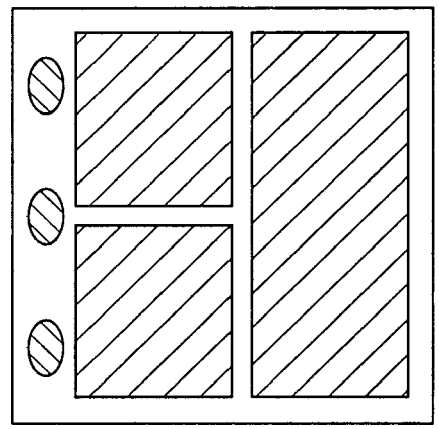
Figure 9:
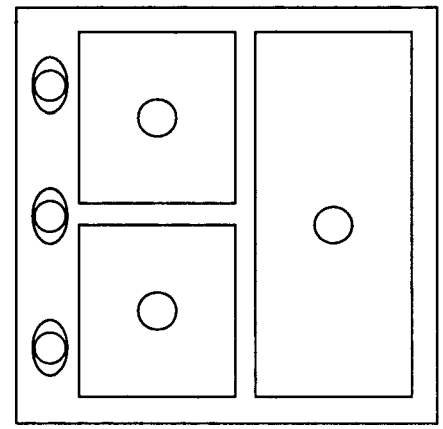
Figure 9:
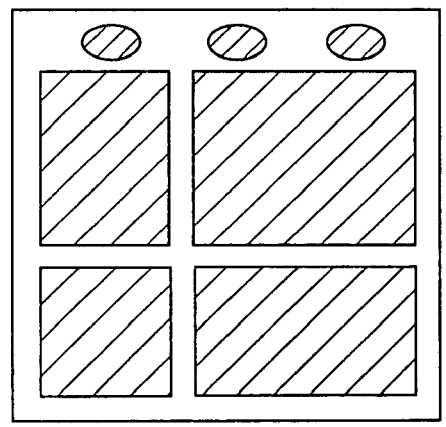
Figure 9:
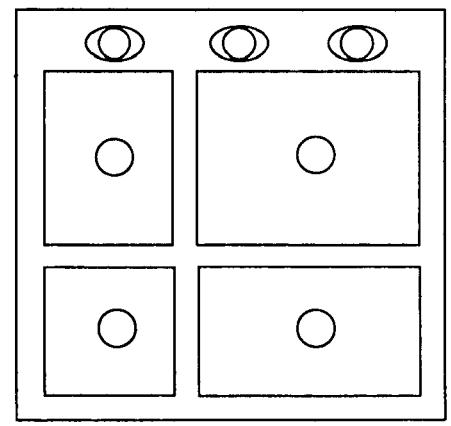

The nine distinct touch areas 505, 506, 507 have the flexibility to control 2, 3, or 4 different soda flavors, and three bonus or additive flavors, such as vanilla, lemon, or cherry as shown in FIG. 8b. The larger touch areas are typically used as soda brand buttons 508, and the smaller elliptical areas are typically used as bonus or additive flavor and water buttons 509. Various configurations can be obtained by activating different touch pads. FIG. 8c shows the user interface in the fully assembled configuration for the 2, 3, or 4 flavor configurations in this preferred embodiment. The touch pad configurations are not limited to those identified in this disclosure, as the design is flexible and can support different layouts of touch sensor areas and touch pads including those represented in FIG. 9.

Figure 9A:
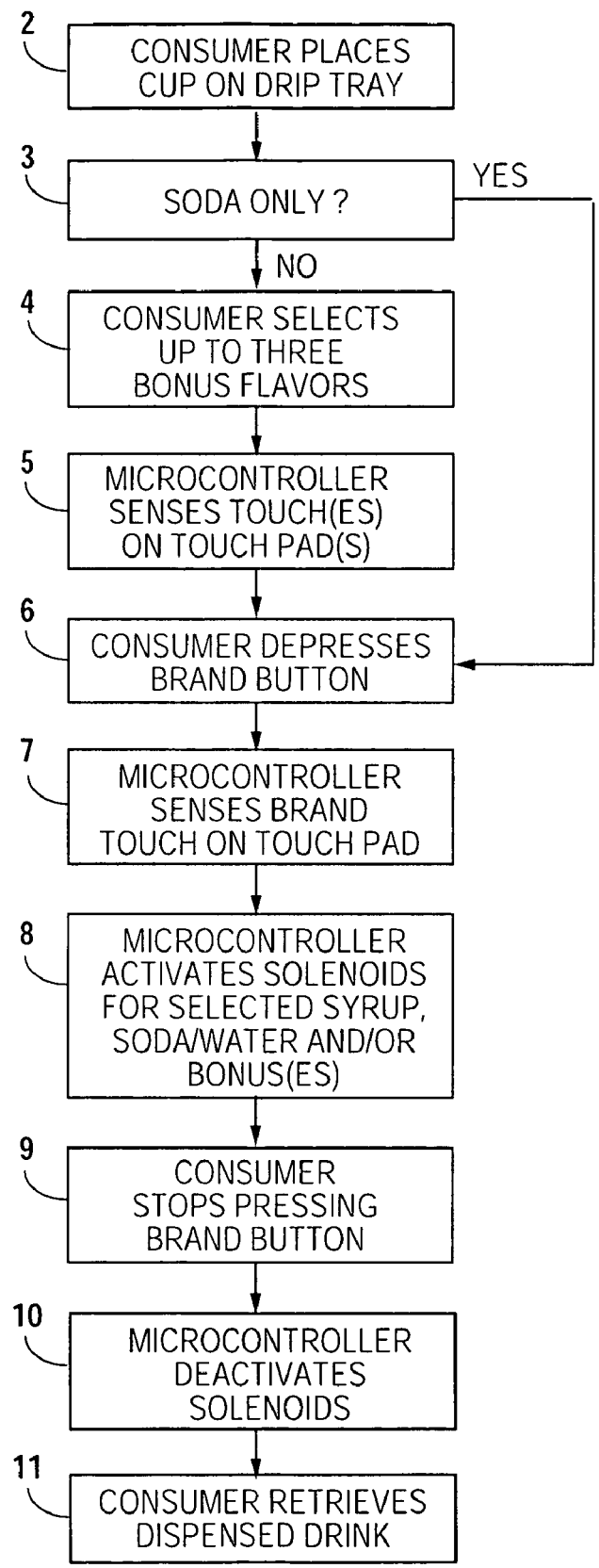
FIG. 9a provides a method flowchart for dispensing a drink.

In operation, a consumer is able to dispense multiple types of drinks from the same touch panel assembly 200, as described in the method flowchart of FIG. 9a. In step 2, a consumer desiring to dispense a drink from dispenser 100 must place a cup on a drip tray underneath a desired nozzle. In step 3, the consumer has an option as to his next step. If the consumer wishes to have just a brand of soda, he jumps to step 6, where he pushes and holds the desired brand button 508. The microcontroller senses the touch on the touch panels in step 7, and activates the solenoids for the soda/water and the corresponding brand, step 8. When the consumer is satisfied with the amount of beverage dispensed, he stops pressing the brand touch pad, step 9, and the microcontroller deactivates the solenoids 410, as shown in step 10. At which point the consumer retrieves his drink, step 11. If the consumer desires a brand drink with bonus flavor(s), he would depress and release up to three of the desired bonus flavor buttons 509, as described in step 4. The microcontroller senses these touches step 5, and waits for the consumer to press a brand button on the touch panel assembly 200. The consumer then touches and holds the desired brand button 508 on the touch panel 200, step 6, where the microcontroller senses the touch, step 7, and activates the proper bonus(es), syrup, and soda/water solenoid, step 8. Once the consumer is satisfied with the amount drink in his cup, he stops pressing the brand button 508, step 9, where the microcontroller senses the lack of touch and deactivates the solenoids, step 10. The consumer can now retrieve his drink from the cup rest, step 11.

Portion controlled drinks could also be dispensed by using the bonus buttons 509 as either Cup Size indicators (one button being a "Small" sized drink, another a "Medium" sized drink, and the third as a "Large" sized drink), or as one of the buttons being used as a toggle switch between a standard (non-portion controlled, as described in the aforementioned paragraph), small, medium, and large dispense modes. The benefit of the latter arrangement would be the ability to still have up to 2 bonus flavors added to a portion controlled drink (one would be used as the portion control switch). Different modes could be indicated by specific flashing sequences. As an example: no flashes indicates a standard dispense routine, "fast" flashes (on the order of once every quarter second) could indicate a small dispense routine, "medium" flashes (every half second) could indicate a medium sized dispense, and a slow flash sequence (once every second) could indicate a large sized dispense. The routines could scroll through each of the modes, so as to return to the original routine with enough subsequent toggles.

The dispenser 100 may be set to operate two distinct ways, namely, in an "Active" and a "Passive" mode. In the "Active" mode, the software is able to determine which solenoids are required for certain flavor configurations. In this scheme, there is no software change required to change the flavor configurations, since the software will make the configuration change automatically. In the "Passive" mode, the user can define touch panel assembly 200 configurations, by manually telling the software which are major and minor buttons.

Figures 10, 10A:
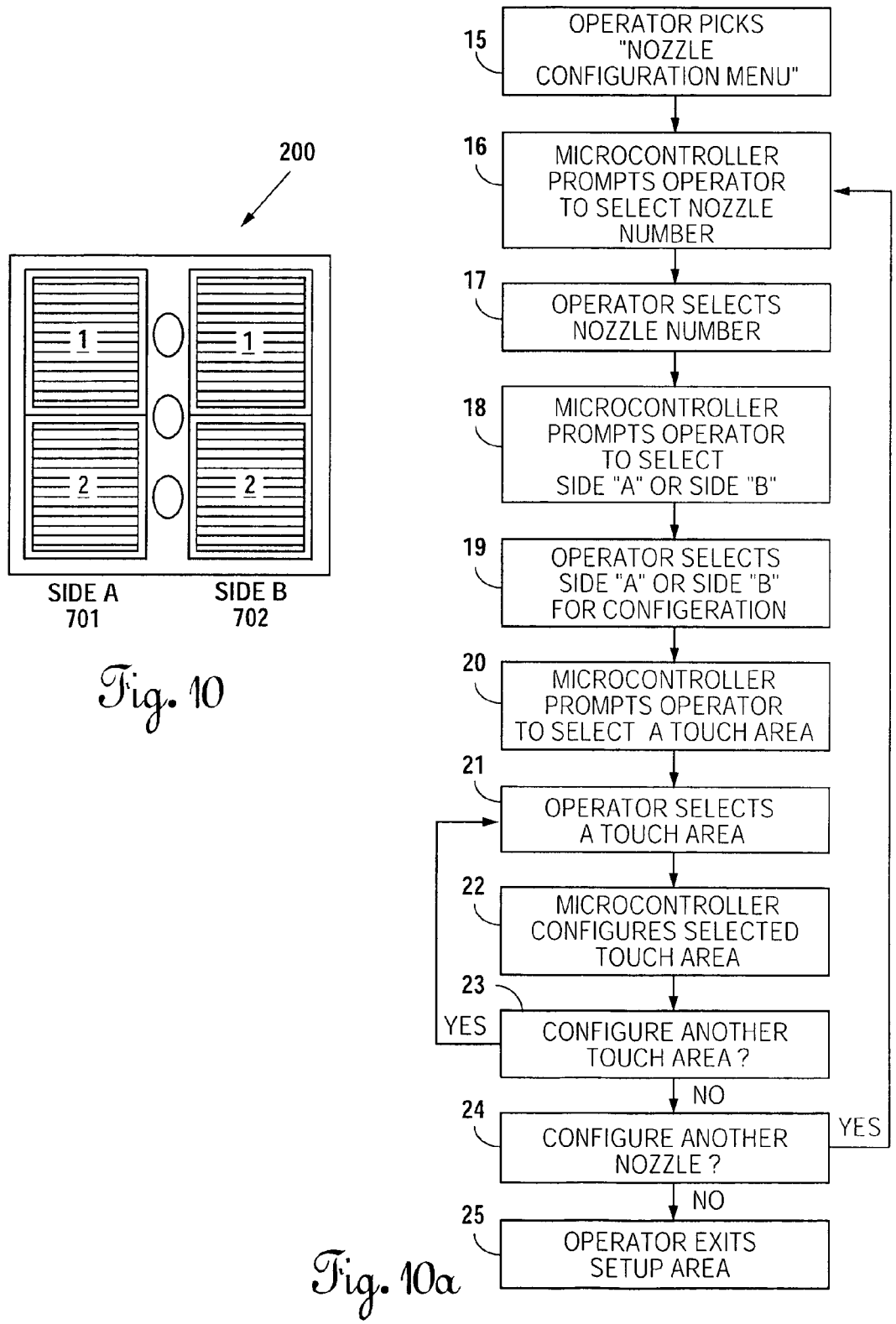
FIG. 10 illustrates the front of a touch pad assembly.
FIG. 10a provides a method flowchart for passive configuration of touch pad assemblies using a menu structure.

A touch panel assembly 200 has a side "A" 701 and a side "B" 702 as shown in the front view of FIG. 10. Upon installation or when serviced, if reconfiguration is desired, the touch panel assembly 200 must be configured to determine whether the side "A" 701 or side "B" 702 of the touch panel will be used as major brand areas or minor brand areas. Prior to configuration, the operator may prompt the dispenser 100 to display the current configuration of the touch pad assemblies 200. LED's 314 can indicate the current configuration of the entire dispenser 100 by flashing together, as a major, or in sequence, as two minor brands. This feature may be toggled in the menu structure.

In the "Passive" configuration mode, reconfiguration is accomplished through a software routine as described in the method flowcharts of FIGS. 10a and 10b. FIG. 7a provides the interactive steps involved in using a menu structure to manually configure the dispenser 100. In this process, a display and a controller board are used to prompt the operator for selections from a menu display. As shown in step 15, the operator selects a menu called "NOZZLE CONFIGURATION." The microcontroller then prompts the operator to select a nozzle number from the menu in step 16. The operator selects a nozzle number, step 17. The microcontroller then prompts the operator to pick either an "A" or a "B" side as shown in step 18. The operator, in step 19, then picks either the "A" or "B" side for configuring. In step 20, the microcontroller then prompts the operator to select a touch area 505, 506, 507 for configuring. The operator then picks a touch area 505, 506, 507 for configuring, step 21. In step 22, the microcontroller configures the selected touch area 505, 506, 507 and then prompts the operator for additional touch area 505, 506, 507 configurations, step 23. If additional touch areas 505, 506, 507 on the same touch pad will require configuring, the microcontroller returns to step 20. If no other touch pad changes are required, the microcontroller will move to step 24, and prompt the operator for additional nozzle configuration changes. If additional nozzle changes are required, then the operator will indicate "yes," and the microcontroller will return to step 16. If no other nozzle needs configuring, the microcontroller will then move to step 25 and exit the setup menu.

FIG. 10b provides a second method for major or minor brand configuration. This process begins with a prompt from the microcontroller for the user to select a side to be configured, specifically, an "A" side 701 or a "B" side 702 as shown in step 52. In step 53, the user then selects a side of the touch panel assembly 200 to be configured by touching one of the touch panels on the user interface. Once a side is selected, the microcontroller will prompt for either a major brand (1) or a minor brand (2) configuration in step 54. The operator must now select either a "1" for a major brand or a "2" for a minor brand as disclosed in step 55.

If the operator chooses a major brand, the microcontroller will move to step 56 and prompt the user for a major brand location. The operator will be required to touch the desired touch pad in step 57. At this point, the microcontroller will be awaiting a touch signal from the pad as shown in step 58, or an indication in a MENU. If only touch pad 1 is touched or selected, it will dispense the major brand, steps 59 and 62, upon activation from touch pad 1. If only touch pad 2 is touched as in step 60, then the major brand will be dispensed upon activation from touch pad 2. Finally, if the operator touches both touch pad 1 and touch pad 2, then the major brand will be dispensed upon activation of both touch pads 1 and 2 as shown in steps 61 and 62.

Similarly, if the operator chooses a minor brand 2 in step 55, the microcontroller will prompt the operator for a minor brand location as shown in 63. The operator will touch a pad in step 64, and the microcontroller will be looking for a touch signal from the touch panel assembly 200 in step 65. If only touch pad 1 is touched as in step 66, then the dispenser will dispense the minor brand upon activation from touch pad 1 as in step 69. If only touch pad 2 is touched as in step 68, then the minor brand will be dispensed upon activation of touch pad 2 as shown in step 71. Finally, if both touch pads 1 and 2 are touched, the dispenser will dispense nothing as shown in steps 67 and 70.

Further operations required for dispenser configuration include setup of decals 334 that reside in the front bezels 205 for both the major and minor brands. Setup of the decals 334 usually takes place after configuration of the touch pad assemblies 200 shown in steps 52 through 71 and steps 15 through 25. In step 72 of FIG. 10b, the front bezel 205 must be removed to allow removal of existing decals 334 as shown in step 73. If the touch pad assembly 200 is being reconfigured, then existing decals 334 must be removed. Step 74 provides for installation of new decals 334 followed by installation of a proper major or minor brand bezel 205. For a minor brand, setup of the decals 334 follows the procedure as discussed in steps 76-79. After valve configuration, the front bezel 205 must be removed to access the decal mounting area as in step 76. If the operator is reconfiguring, the existing decals 334 must be removed as shown in step 77. With any decals 334 removed, the operator can now install the minor brand decals 334 discussed in step 78. Finally, the operator will be required to install a "two-minor brand" bezel 205.

Figure 10C:
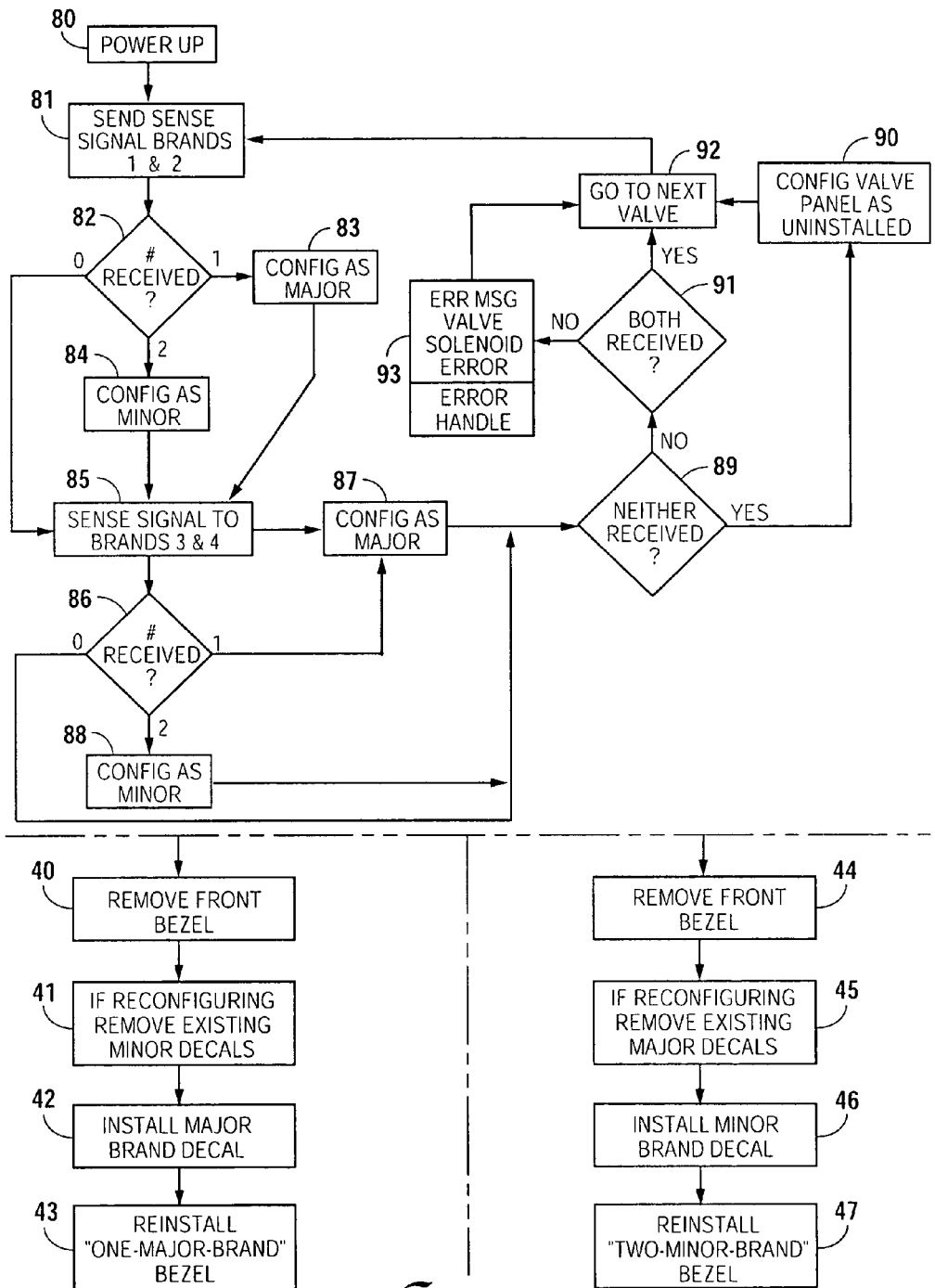
FIG. 10c provides a method flowchart for active configuration of sensing valves.
Figure 11:
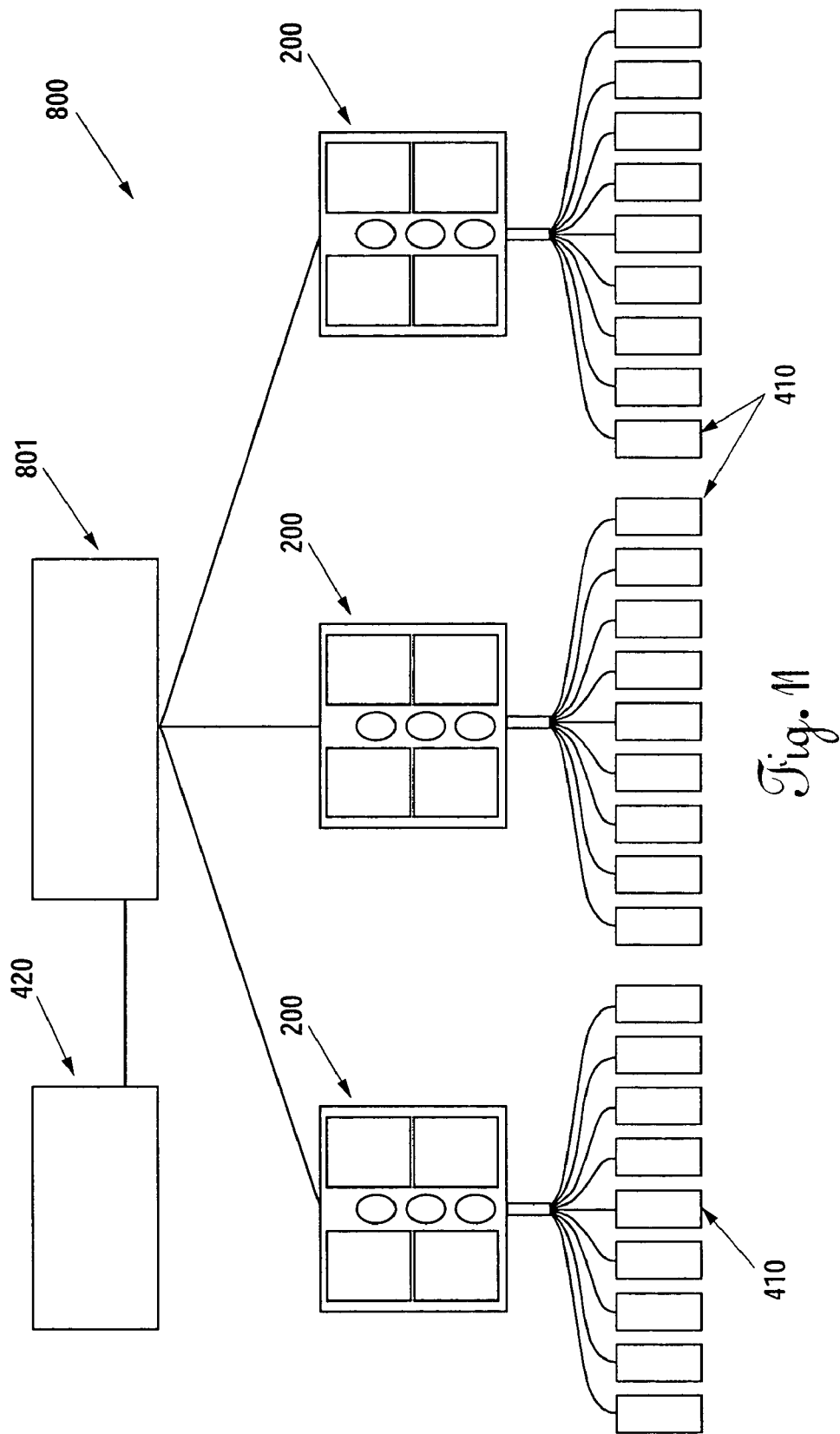
FIG. 11 illustrates a multi-panel/single controller control scheme.

FIG. 10c provides a method flowchart for configuration in the active mode. Once the microcontroller is powered up in step 80, low voltage "sense" signals are sent out for brands 1 and 2 of side A (FIG. 10) as shown in step 81. The low voltage sense signals will not activate the solenoids 410; they are exclusively for monitoring and configuration purposes. In step 82, the microcontroller then determines how many senses were obtained. If no return senses were obtained from side A, the microcontroller moves on to send sense signals to brands 3 and 4 (side B) step 85. If one sense is obtained, the touch panel is configured as a major brand step 83, and the microcontroller will move on to step 85, where it sends a sense signal to brands 3 and 4 (side B). If the microcontroller receives two sense signals as shown in step 84, the touch panel will be configured as minor brands, and the microcontroller will then proceed to step 85, where the microcontroller will begin to send sense signals to brands 3 and 4 (side B). In step 86, the microcontroller evaluates the sense signal responses to determine how to configure the touch panel assemblies 200. If only one sense signal is received, side B is configured as a major brand as shown in step 87 and moves to step 89. If two sense signals are received, the microcontroller configures side B as minor brands in step 88 and then moves to step 89. If no sense signals are received in step 86, the microcontroller moves to step 89 where it determines if both brands 1 and 2 (side A) and brands 3 and 4 (side B) received a zero reading in response to the sense signal output. If neither brands 1 and 2 (side A), nor brands 3 and 4 (side B) received a reading, the valve will be configured as uninstalled in step 90, and will then move on to the next valve in step 92. If at least one signal was received in step 89, a "NO" answer to "NEITHER RECEIVED?" the microcontroller proceeds to step 91. If both signals are received, the microcontroller moves to the next valve in step 92. If one of the two signals was NOT received in step 91, then there must be a solenoid disconnected, or one of the wires broken, resulting in a "SOLENOID ERROR" message being displayed step 93. The microcontroller would then go to step 92, and proceed to the next valve.

Regardless of the method used for configuring, the operator will be required to setup the decals for the dispenser 100 after the touch areas have been configured. This setup process is the same as for passive configuration of the dispenser 100. In step 40 of FIG. 10b, the front bezel 205 must be removed to allow removal of existing decals 334 as shown in step 41. If the touch panel assembly 200 is being reconfigured, then existing decals 334 must be removed. Step 42 provides for installation of new decals 334 followed by installation of a proper major or minor brand bezel 205 as shown in step 43. For a minor brand, setup of the decals 334 follows the procedure as discussed in steps 44-47. After valve configuration, the front bezel 205 must be removed to access the decal mounting area as in step 44. If the operator is reconfiguring, the existing decals 334 must be removed as shown in step 45. With any decals 334 removed, the operator can now install the minor brand decals 334 discussed in step 46. Finally, the operator will be required to install a "two-minor brand" bezel 205 as discussed in step 47.

Another embodiment of this invention may include a multiple touch panel-single controller 800 setup as shown in FIG.

11. In this scenario, a multi-panel controller 801 is connectable to a power supply 420 and multiple touch panel assemblies 200. The touch panel assemblies 200, in turn, are connected to multiple solenoids 410 to provide a unified dispensing arrangement. With this type of arrangement, the multi-panel controller 801 is able to oversee and regulate the operations of the touch panel assemblies 200 to optimize the dispensing functions or other operations including valve specific or dispenser 100 wide lighting routines. The multi-panel controller 801, typically, limits the number of simultaneous dispenses to two, in order to assure adequate cold plate performance. The multi-panel controller 801 may also control dispenser 100 specific operations including ice management, carbonator probe detection, and ice agitation.

Due to the modularity of the foregoing system, dispensers 100 may be as simple as a power supply 420 coupled with a touch pad assembly 200 to control a single nozzle tower dispenser. When utilizing the multiple touch panel-single controller 800 scheme, the electronic setup allows the same multi-panel controller 801 to be used, as well as the same touch panel assemblies 200 in varying quantities, four for up to a 16 flavor dispenser, five for an up to twenty flavor dispenser, and so on. Further benefits of the modularity include the reduction of hardware associated with the dispensing nozzles. In a modular setup, the same components can be used repeatedly, thereby reducing overhead and inventory in the production environment.

Although the present invention has been described in terms of the foregoing preferred embodiment, such description has been for exemplary purposes only and, as will be apparent to those of ordinary skill in the art, many alternatives, equivalents, and variations of varying degrees will fall within the scope of the present invention. That scope, accordingly, is not to be limited in any respect by the foregoing detailed description; rather, it is defined only by the claims that follow.

We claim:

1. A beverage dispenser, comprising:
    a housing;
    a touch panel assembly mountable to the housing, the touch panel assembly including a controller, a flow activator, and an electrode board, wherein the electrode board includes an electrode trace that develops an electrode field, further wherein the controller interprets an interruption in the electrode field as a user input; and
    a beverage dispensing nozzle mounted on the housing, the beverage dispensing nozzle communicating with a beverage source, wherein responsive to a user input received by the electrode traces, the controller energizes the flow activator, thereby facilitating the delivery of a prescribed amount of beverage through the beverage dispensing nozzle.

2. The beverage dispenser according to claim 1, wherein the flow activator comprises a field effect transistor.

3. The beverage dispenser according to claim 1, wherein the beverage is a syrup concentrate.

4. The beverage dispenser according to claim 3, further comprising a diluent used to dilute the beverage syrup concentrate.

5. The beverage dispenser according to claim 1, further comprising a bonus flavor for adding to dispensed beverages.

6. The beverage dispenser according to claim 1, further comprising multiple beverage dispensing nozzles mounted to the housing.

7. The beverage dispenser according to claim 6, wherein the controller regulates a flow activators for each of the beverage dispensing nozzles.

8. A beverage dispenser, comprising:
    a housing;
    multiple dispensing valves disposed on the housing;
    multiple touch panel assemblies disposed on the housing for regulating the flow of beverages through the dispensing valves, wherein each multiple touch panel assembly includes a light source; and
    a controller disposed within the housing for regulating the operations of the multiple touch panel assemblies, wherein the controller activates the light sources in the touch panel assemblies in a prescribed sequence to attract consumers to the beverage dispenser.

9. The beverage dispenser according to claim 8, wherein the controller optimizes dispensing operations of the beverage dispenser.

10. The beverage dispenser according to claim 8, wherein the controller conducts ice management operations.

11. The beverage dispenser according to claim 8, wherein the controller oversees carbonator probe operations.

* * * * *